United States Patent
Choi et al.

(10) Patent No.: US 10,297,771 B2
(45) Date of Patent: May 21, 2019

(54) BENDABLE DISPLAY APPARATUS

(71) Applicant: SAMSUNG DISPLAY CO., LTD., Yongin-si, Gyeonggi-do (KR)

(72) Inventors: Yoonsun Choi, Yongin-si (KR); Wonsuk Choi, Yongin-si (KR); Cheolsu Kim, Yongin-si (KR); Sangjo Lee, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 41 days.

(21) Appl. No.: 15/342,248

(22) Filed: Nov. 3, 2016

(65) Prior Publication Data

US 2017/0317299 A1 Nov. 2, 2017

(30) Foreign Application Priority Data

Apr. 29, 2016 (KR) .................. 10-2016-0053548

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3262* (2013.01); *H01L 27/3276* (2013.01); *H01L 51/5253* (2013.01); *H01L 2251/5338* (2013.01); *Y02E 10/549* (2013.01)

(58) Field of Classification Search
CPC ................................ H01L 27/32; H01L 51/56

USPC .............................................. 257/40; 438/23
See application file for complete search history.

(56) References Cited

U.S. PATENT DOCUMENTS

| | | | | |
|---|---|---|---|---|
| 2004/0263740 A1* | 12/2004 | Sakakura | ............ | H01L 51/5237 349/138 |
| 2007/0236425 A1* | 10/2007 | Furuie | ................ | H01L 51/5275 345/77 |
| 2013/0148312 A1* | 6/2013 | Han | ........................ | H05K 7/00 361/736 |
| 2014/0097408 A1* | 4/2014 | Kim | .................... | H01L 27/3237 257/40 |

(Continued)

FOREIGN PATENT DOCUMENTS

KR 10-2010-0018006 A 2/2010
KR 10-2014-0099139 A 8/2014

(Continued)

*Primary Examiner* — Sheng-Bai Zhu
(74) *Attorney, Agent, or Firm* — Lee & Morse P.C.

(57) ABSTRACT

A display apparatus may include a substrate having a first bending area between a first area and a second area, the first bending area to be bent with a first bending axis that extends along a first direction, as a center; a first inorganic insulating layer on the substrate and having a first opening corresponding to the first bending area; a first organic material layer filling at least a portion of the first opening; and a first conductive layer that extends from the first area to the second area through the first bending area and is on the first organic material layer. The first organic material layer may have a concavo-convex surface at least in a portion of an upper surface thereof. At least a portion of the first conductive layer may extend along a third direction forming an angle of about 0° to about 90° with the first direction.

23 Claims, 22 Drawing Sheets

(56) References Cited

U.S. PATENT DOCUMENTS

| | | | | |
|---|---|---|---|---|
| 2014/0217373 A1* | 8/2014 | Youn | ................... | H01L 23/4985 |
| | | | | 257/40 |
| 2014/0217397 A1 | 8/2014 | Kwak et al. | | |
| 2014/0353609 A1* | 12/2014 | Song | ................... | H01L 27/3276 |
| | | | | 257/40 |
| 2015/0034366 A1* | 2/2015 | Yoshioka | ............... | H05K 1/111 |
| | | | | 174/251 |
| 2015/0137102 A1 | 5/2015 | Yang | | |
| 2016/0035812 A1* | 2/2016 | Kwon | ................. | H01L 27/3276 |
| | | | | 257/40 |

FOREIGN PATENT DOCUMENTS

| | | |
|---|---|---|
| KR | 10-2014-0099164 A | 8/2014 |
| KR | 10-2015-0059048 A | 5/2015 |
| KR | 10-2015-0061769 A | 6/2015 |
| WO | WO 2014/119851 A1 | 8/2014 |

\* cited by examiner

BENDABLE DISPLAY APPARATUS

CROSS-REFERENCE TO RELATED APPLICATION

Korean Patent Application No. 10-2016-0053548, filed on Apr. 29, 2016, in the Korean Intellectual Property Office, and entitled: "Display Apparatus," is incorporated by reference herein in its entirety.

BACKGROUND

1. Field

One or more embodiments relate to a display apparatus, and more particularly, to the display apparatus which may assure a long usage life, while defects may be reduced.

2. Description of the Related Art

In general, a display apparatus has a display unit on a substrate. Visibility from various angles may be improved or an area of a non-display region may be reduced, by bending a portion of the display apparatus.

However, problems are generated in conventional display apparatuses that defects occur during a manufacturing process of a bent display apparatus or a usage life thereof is reduced.

SUMMARY

In accordance with one or more embodiments, a display apparatus may include a substrate having a first bending area between a first area and a second area, the first bending area to be bent with a first bending axis that extends along a first direction, as a center; a first inorganic insulating layer on the substrate and having a first opening corresponding to the first bending area; a first organic material layer filling at least a portion of the first opening; and a first conductive layer that extends from the first area to the second area through the first bending area and is on the first organic material layer. The first organic material layer may have a concavo-convex surface at least in a portion of an upper surface thereof. At least a portion of the first conductive layer may extend along a third direction forming an angle of about 0° to about 90° with the first direction.

According to an embodiment, at least a portion of the first conductive layer may be extended along the third direction in the first bending area.

According to an embodiment, the third direction may form an angle of about 45° with the first direction, and at least a portion of the first conductive layer may form an angle of about 45° with the first bending axis.

According to an embodiment, the third direction may form an angle of about 90° with the first direction, and at least a portion of the first conductive layer may be arranged perpendicular to the first bending axis.

According to an embodiment, at least a portion of the first conductive layer may be arranged in parallel with the first bending axis.

According to an embodiment, an area of the first opening may be larger than that of the first bending area.

According to an embodiment, the first organic material layer may have the concavo-convex surface only in the first opening.

According to an embodiment, a shape of an upper surface of the first conductive layer on the first organic material layer may correspond to that of an upper surface of the first organic material layer.

According to an embodiment, the concavo-convex surface may have a plurality of protrusion axes extended along a fourth direction forming an angle of about 0° to about 90° with the first direction.

According to an embodiment, the concavo-convex surface may include a plurality of protruded areas which are respectively formed with the plurality of protrusion axes as centers, in a fifth direction perpendicular to the fourth direction.

According to an embodiment, a distance between a central portion of the first opening and the plurality of protrusion axes may be shorter than that between another portion in the first opening and the plurality of protrusion axes.

According to an embodiment, heights from an upper surface of the substrate to the plurality of protruded areas, at the central portion of the first opening may be greater than those from the upper surface of the substrate to the plurality of protruded areas, at another portion of the first opening.

According to an embodiment, the display apparatus may further include a second organic material layer on the first conductive layer and filling at least a portion of the first opening.

According to an embodiment, the second organic material layer may include a concavo-convex surface at least at a portion of an upper surface thereof.

According to an embodiment, the second organic material layer may include the concavo-convex surface only in the first opening.

According to an embodiment, a shape of the concavo-convex surface on the upper surface of the second organic material layer may correspond to that of the concavo-convex surface on the upper surface of the first organic material layer.

According to an embodiment, the first conductive layer may include a first surface facing the substrate at least at a portion thereof, a second surface which is an opposite surface to the first surface, and at least one hole penetrating from the first surface to the second surface.

According to an embodiment, the first conductive layer may include the hole only in the first opening.

According to an embodiment, the first conductive layer may include the hole, only at locations corresponding to the first bending area.

According to an embodiment, the display apparatus may further include a stress neutralization layer arranged over the first conductive layer and the stress neutralization layer may include an organic material.

According to an embodiment, the display apparatus may include a thin film transistor in the first area or the second area, the thin film transistor having a source electrode, a drain electrode, and a gate electrode; and an encapsulation layer that covers a display device in the first area.

According to an embodiment, the display apparatus may further include a second conductive layer in the first area or the second area, the second conductive layer being on a layer different from the first conductive layer, and is electrically connected to the first conductive layer.

According to an embodiment, an elongation percentage of the first conductive layer may be larger than that of the second conductive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
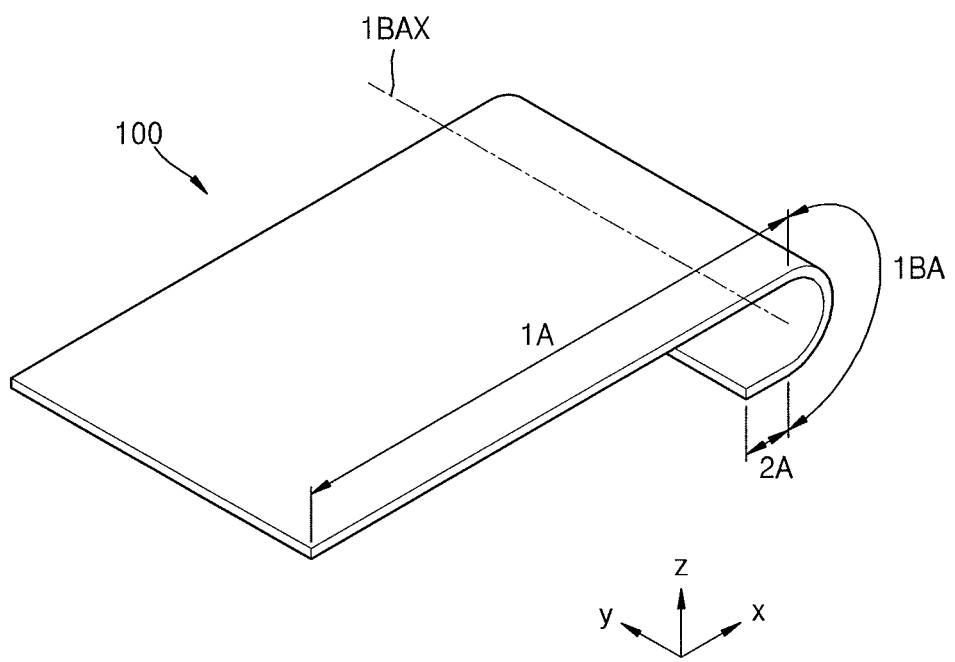
FIG. 1 illustrates a perspective view of a display apparatus according to one or more embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
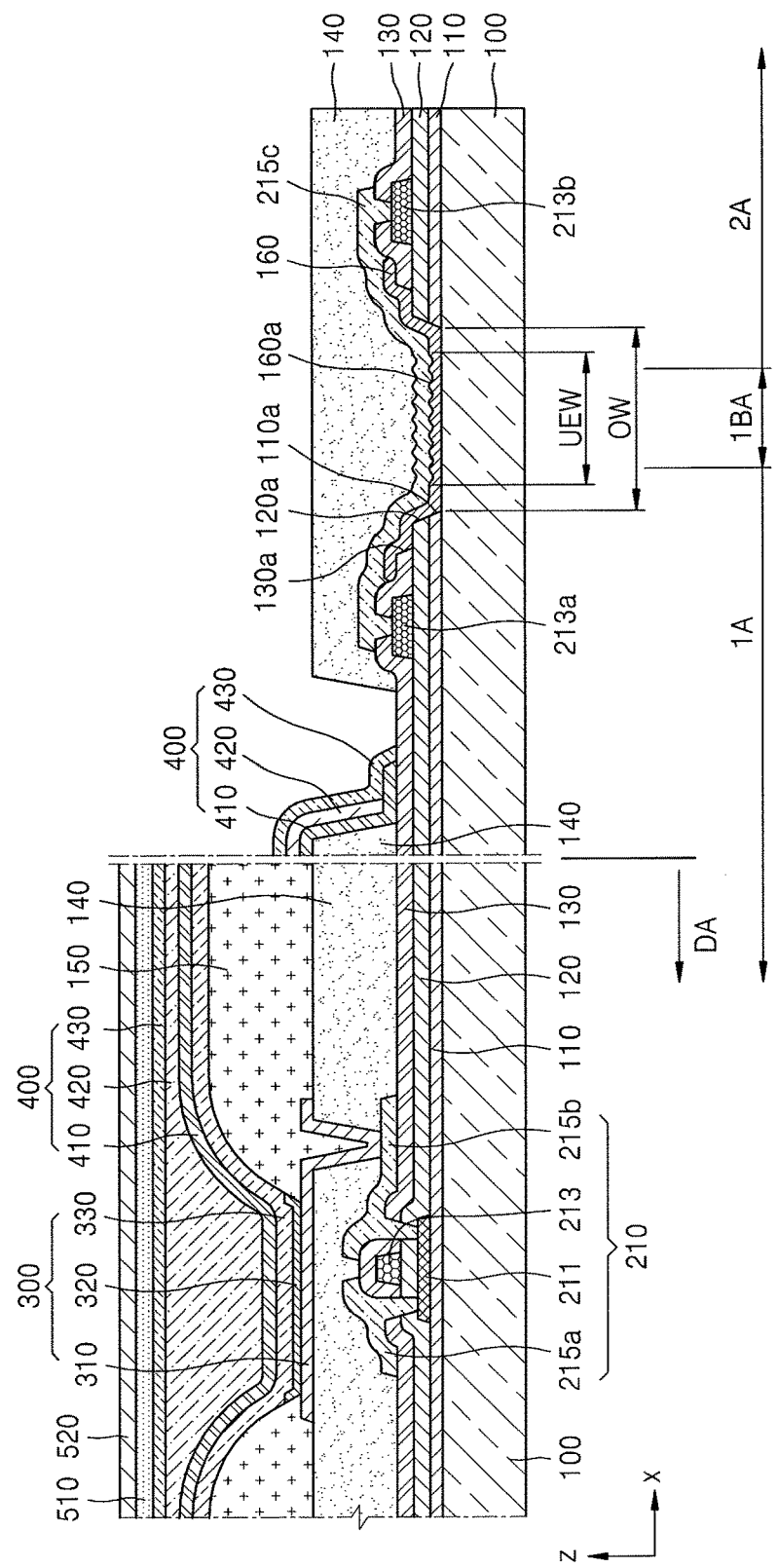
FIG. 2 illustrates a cross-sectional view of a portion of the display apparatus of FIG. 1.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another FIG. 1 is a perspective view of a display apparatus according to one or more embodiments, and FIG. 2 is a cross-sectional view of a portion of the display apparatus of FIG. 1. According to an embodiment, a portion of a substrate 100, i.e., a portion of the display apparatus, may have a bent shape as illustrated in FIG. 1. However, the display apparatus is illustrated in an un-bent state in FIG. 2 for the ease of illustration convenience. For reference, the display apparatus will be illustrated in the un-bent state for the ease of illustration convenience in cross-sectional views and plan views of embodiments to be described below.

As illustrated in FIGS. 1 and 2, the substrate 100 included in the display apparatus may have a first bending area 1BA which extends along a first direction (a+y direction) according to an embodiment. The first bending area 1BA may be between a first area 1A and a second area 2A in a second direction (a+x direction) which is perpendicular to the first direction. In addition, the substrate 100 may be bent with a first bending axis 1BAX, which extends along the first direction (the +y direction), as a center, as illustrated in FIG. 1. The substrate 100 may include various materials having flexible or bendable characteristics, e.g., polymer resins such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), and cellulose acetate propionate (CAP).

The first area 1A may include a display area DA. The first area 1A may include a portion of a non-display area outside the display area DA in addition to the display area DA, as illustrated in FIG. 2. According to another embodiment, the second area 2A may also include the display area DA and/or the non-display area.

As illustrated in FIG. 2, the display area DA of the substrate 100 may include a display device 300 and a thin film transistor (TFT) 210, to which the display device 300 is electrically connected. The display device 300 may include an organic light-emitting device (OLED) in the display area DA. A pixel electrode of the OLED maybe electrically connected to the TFT 210. A thin film transistor (TFT) may be in a peripheral area PA outside the display area DA of the substrate 100, when needed. The TFT arranged in the peripheral area PA may be, for example, a portion of a circuit unit to control an electrical signal applied to the display area DA.

The TFT 210 may include a semiconductor layer 211, a gate electrode 213, a source electrode 215a, and a drain electrode 215b, which may include amorphous silicon, polycrystalline silicon or organic semiconductor materials. A gate insulating layer 120 may be between the semiconductor layer 211 and the gate electrode 213. The gate insulating layer 120 may include inorganic materials, e.g., silicon oxide, silicon nitride, and/or silicon oxynitride to secure insulation between the semiconductor layer 211 and the gate electrode 213. An interlayer insulating layer 130 may be arranged on the gate electrode 213, the interlayer insulating layer 130 including inorganic materials, e.g., silicon oxide, silicon nitride, and/or silicon oxynitride. The source electrode 215a and the drain electrode 215b may be arranged on the interlayer insulating layer 130. Insulating layers including inorganic materials may be formed via chemical vapor deposition (CVD) or atomic layer deposition (ALD). This method may be applied to embodiments and various modifications thereof described below.

A buffer layer 110 may be between the TFT 210 and the substrate 100 in a structure described above. The buffer layer 110 may include inorganic materials, e.g., silicon oxide, silicon nitride, and/or silicon oxynitride. The buffer layer 110 may increase flatness of an upper surface of the substrate 100 and/or may prevent or reduce infiltration of impurities from the substrate 100, etc., to the semiconductor layer 211 of the TFT 210. According to another embodiment, the buffer layer 110 may include a single layer or two or more layers.

A planarization layer 140 may be arranged on the TFT 210. For example, when the OLED is arranged over the TFT 210, as illustrated in FIG. 2, the planarization layer 140 may planarize an upper surface of a protection layer covering the TFT 210. The planarization layer 140 may include, for example, organic materials, e.g., acryl, benzocyclobutene (BCB), and hexamethyldisiloxane (HMDSO). The planarization layer 140 is illustrated as a single layer in FIG. 2; however, the planarization layer 140 may be variously modified. For example, the planarization layer 140 may have a multi-layer structure. In addition, the planarization layer 140 may include an opening outside the display area DA, as illustrated in FIG. 2, so that a portion of the planarization layer 140 in the display area DA and a portion of the planarization layer 140 in the second area 2A may be physically separate from each other. Such arrangement may reduce or prevent impurities from the outside from reaching the inside of the display area DA through the planarization layer 140.

The OLED including the pixel electrode 310, a counter electrode 330, and an intermediate layer 320, including a light-emitting layer therebetween, may be arranged on the planarization layer 140, in the display area DA of the substrate 100. The pixel electrode 310 may contact any one of the source electrode 215a and the drain electrode 215b, and may be electrically connected to the TFT 210 via an opening formed in the planarization layer 140, etc., as illustrated in FIG. 2.

A pixel definition layer 150 may be arranged on the planarization layer 140. The pixel definition layer 150 may define a pixel by an opening corresponding to respective sub-pixels, that is, an opening to allow at least a central portion of the pixel electrode 310 to be exposed. In addition, as illustrated in FIG. 2, the pixel definition layer 150 may prevent an occurrence of an arc, etc. on edges of the pixel electrode 310 by increasing a distance between edges of the pixel electrode 310 and the counter electrode 330 over the pixel electrode 310. The pixel definition layer 150 may include, for example, organic materials such as PI and HMDSO.

The intermediate layer 320 of the OLED may include low molecular weight materials or polymer materials. When the intermediate layer 320 includes low molecular weight materials, a hole injection layer (HIL), a hole transport layer (HTL), an emission layer (EML), an electron transport layer (ETL), an electron injection layer (EIL), etc., may have laminated structures with a single layer or multiple layers, and include various organic materials such as copper phthalocyanine (CuPc), N,N'-Di(naphthalene-1-yl)-N,N'-diphenyl-benzidine (NPB), and tris(8-hydroxyquinoline) aluminum (Alq3). These layers may be formed via a vacuum deposition method.

When the intermediate layer 320 includes polymer materials, the intermediate layer 320 may have a structure which generally includes an HTL and an EML. In this case, the HTL may include poly 3,4-ethylenedioxythiophene (PEDOT) and the light-emitting layer may include high molecular (polymer) materials such as poly-phenylenevinylene (PPV) and polyfluorene. The intermediate layer 320 may be formed via screen printing, inkjet printing, laser induced thermal imaging (LITI), etc.

However, the intermediate layer 320 is not limited thereto and may have various structures. In addition, the intermediate layer 320 may include an integrated layer covering a plurality of pixel electrodes 310 and a patterned layer to correspond to each of the plurality of pixel electrodes 310.

The common electrode 330 may be arranged in an upper portion of the display area DA and cover the display area DA, as illustrated in FIG. 2. In other words, the common electrode 330 may have an integrated structure including a plurality of OLEDs and thus, may correspond to the plurality of pixel electrodes 310.

Since the OLED may be easily damaged by humidity, oxygen, etc. from the outside, an encapsulation layer 400 may protect the OLEDs by encapsulating the OLEDs. The encapsulation layer 400 may cover the display area DA and extend to outside the display area DA. The encapsulation layer 400 may include a first inorganic encapsulation layer 410, an organic encapsulation layer 420, and a second inorganic encapsulation layer 430, as illustrated in FIG. 2.

The first inorganic encapsulation layer 410 may cover the common electrode 330, and may include silicon oxide, silicon nitride, and/or silicon oxynitride, etc. In addition, other layers, e.g., a capping layer, may be between the first inorganic encapsulation layer 410 and the counter electrode 330, when needed. Since the first inorganic encapsulation layer 410 is formed according to a structure thereunder, an upper surface of the first inorganic encapsulation layer 410 may not be flat. The organic encapsulation layer 420 may cover the first inorganic encapsulation layer 410 and, unlike the first inorganic encapsulation layer 410, an upper surface thereof may be approximately flat. In detail, the upper surface of the organic encapsulation layer 420 may be approximately flat in an area corresponding to the display area DA. The organic encapsulation layer 420 may include at least one material selected from PET, PEN, PC, PI, polyethylene sulfonate (PES), polyoxymethylene (POM), polyallylate, and hexadimethyl siloxane (PDMS). The second inorganic encapsulation layer 430 may cover the organic encapsulation layer 420, and include silicon oxide, silicon nitride, and/or silicon oxynitride, etc. The second inorganic encapsulation layer 430 may prevent the organic encapsulation layer 420 from being exposed to the outside by contacting the first inorganic encapsulation layer 410 at an edge arranged outside the display area DA.

Since the encapsulation layer 400 includes the first inorganic encapsulation layer 410, the organic encapsulation layer 420, and the second encapsulation layer 430, even when cracks occur in the encapsulation layer 400, the cracks may not be extend between the first inorganic encapsulation layer 410 and the organic encapsulation layer 420 or between the organic encapsulation layer 420 and the second encapsulation layer 430 due to such a multilayer structure. Thus, the formation of an infiltration route of humidity or oxygen from the outside to the display area DA may be prevented or reduced because of this effect.

The buffer layer 110, the gate insulating layer 120, and the interlayer insulating layer 130, which includes inorganic materials, may be collectively referred to as a first inorganic insulating layer. The first inorganic insulating layer may include a first opening corresponding to the first bending area 1BA, as illustrated in FIG. 2. In other words, the buffer layer 110, the gate insulating layer 120, and the interlayer insulating layer 130 may respectively have openings 110a, 120a, and 130a, which correspond to the first bending area 1BA, i.e., overlaps the first bending area 1BA. An area of the first opening may be greater than that of the first bending area 1BA. As shown in FIG. 2, an opening width (OW) of the first opening is wider than a width of the first bending area 1B. The area of the first opening may be defined as the smallest area of the areas of the openings 110a, 120a, and 130a of the buffer layer 110, the gate insulating layer 120, and the interlayer insulating layer 130. For example, in the embodiment illustrated in FIG. 2, the area of the first opening may be defined as the area of the opening 110a of the buffer layer 110 in FIG. 2.

As illustrated in FIG. 2, inner side surface of the opening 110a of the buffer layer 110 coincides with an inner side surface of the opening 120a of the gate insulating layer 120, i.e., the inner side surfaces of the opening 110a and the opening 120a continuously extend along an angle towards the substrate 100. However, embodiments are not limited thereto.

According to an embodiment, the display apparatus may include a first organic material layer 160 filling at least a portion of the first opening of the first inorganic insulating layer. The first organic material layer 160 is illustrated as filling the whole first opening in FIG. 2. In addition, the display apparatus may include a first conductive layer 215c according to an embodiment. The first conductive layer 215c may extend from the first area 1A to the second area 2A through the first bending area 1BA, and arranged on the first organic material layer 160. The first conductive layer 215c may be arranged on an inorganic insulating layer, e.g., the interlayer insulating layer 130, where there is no first organic material layer 160. The first conductive layer 215c may be simultaneously formed with the source electrode 215a or the drain electrode 215b and may be formed of the same material.

The display apparatus may include second conductive layers 213a and 213b, in addition to the first conductive layer 215c. The second conductive layers 213a and 213b may be arranged in the first area 1A and/or the second area 2A to on a layer different from the layer on which the first conductive layer 215c is arranged, and may be electrically connected to the first conductive layer 215c. FIG. 2 illustrates that the second conductive layers 213a and 213b include the same material as the gate electrode 213 and are arranged on a same layer as the gate electrode 213, that is, over the gate insulating layer 120. In addition, it is illustrated that the first conductive layer 215c contacts the second conductive layers 213a and 213b via contact holes H formed in the interlayer insulating layer 130. It is also illustrated that the second conductive layer 213a is arranged in the first area 1A and the second conductive layer 213b is arranged in the second area 2A.

While FIG. 2 illustrates that the second conductive layer 213b is covered by the planarization 140, at least a portion of an upper surface of the second conductive layer 213b may not be covered by the planarization layer 140, etc., but may be exposed to the outside. Thus, the second conductive layer 213b may be electrically connected to various electronic devices, a PCB, etc.

The second conductive layer 213a arranged in the first area 1A may be electrically connected to the TFT, etc., in the display area DA, and accordingly, the first conductive layer 215c may be electrically connected to the TFT, etc., in the display area DA via the second conductive layer 213a. The second conductive layer 213b arranged in the second area 2A may also be electrically connected to the TFT, etc., in the display area DA via the first conductive layer 215c. The second conductive layers 213a and 213b may be electrically connected to components arranged in the display area DA, while being arranged outside the display area DA. In addition, the second conductive layers 213a and 213b may extend along a direction of the display area DA and at least a portion thereof may be arranged in the display area DA, while being arranged outside the display area DA.

As described above, the display apparatus is illustrated in an un-bent state in FIG. 2 for the sake of convenience; however, the display apparatus according to an embodiment is actually in a state in which the substrate 100, etc. are bent in the first bending area 1BA, as illustrated in FIG. 1. In this structure, the substrate 100 of the display apparatus may be manufactured in approximately a flat state in a manufacturing process, as illustrated in FIG. 2, and thereafter, the display apparatus may be allowed to have a shape as approximately illustrated in FIG. 1 by bending the substrate 100, etc. in the first bending area 1BA. In this case, components arranged in the first bending area 1BA may receive the tension stress in a process of bending the substrate 100, etc. in the first bending area 1BA.

Accordingly, when the first conductive layer 215c crossing the first bending area 1BA, the occurrence of a crack in the first conductive layer 215c or defects such as a broken wire in the first conductive layer 215c may be reduced or prevented by including a material with a high elongation percentage. In addition, an efficiency of electrical signal transfer in the display apparatus may be enhanced or an occurrence rate of defects in the manufacturing process may be reduced, by forming the second conductive layers 213a 213c in the first area 1A or the second area 2A with materials which have elongation percentages lower than that of the first conductive layer 215c, while having electrical/physical characteristics different from those of the first conductive layer 215c. For example, the second conductive layers 213a and 213b may include molybdenum, while the first conductive layer 215c may include aluminum. In addition, either the first conductive layer 215c or the second conductive layers 213a and 213b may have a multilayer structure, when needed.

As illustrated in FIG. 2, the first organic material layer 160 covers an inner side surface of the first opening of the first inorganic insulating layer. As described above, since the first conductive layer 215c may be simultaneously formed with the source electrode 215a and the drain electrode 215b, with same material, a conductive layer may be formed on the entire surface of the substrate 100. Thereafter, the source electrode 215a, the drain electrode 215b, and the first conductive layer 215c may be formed by patterning the conductive layer. When the first organic material layer 160 does not cover the inner side surface of the opening 110a of the buffer layer 110, the inner side surface of the opening 120a of the gate insulating layer 120, and/or the inner side surface of the opening 130a of the interlayer insulating layer 130, conductive material may not be removed during patterning, but remain on the inner side surface of the opening 110a of the buffer layer 110, on the inner side surface of the opening 120a of the gate insulating layer 120, and/or on the inner side surface of the opening 130a of the interlayer insulating layer 130. Thus, the remaining conductive material may cause a short between other conductive layers.

Thus, when the first organic material layer 160 is formed, the first organic material layer 160 may cover the inner side surface of the first opening of the first inorganic insulating layer. For reference, the first organic material layer 160 is illustrated to have a uniform thickness in FIG. 2. However, the first organic material layer 160 may have a varying thickness depending on locations such that a bending slope on the upper surface of the first organic material layer 160 may be smooth on the inner side surface of the opening 110a of the buffer layer 110, on the inner side surface of the opening 120a of the gate insulating layer 120, and/or around the inner side surface of the opening 130a of the interlayer insulating layer 130. Accordingly, presence of conductive material which should be removed by patterning may be effectively reduced or prevented.

As illustrated in FIG. 2, the first organic material layer 160 may include a concavo-convex surface 160a at least in a portion of the upper surface (in a+z direction) thereof. Since the first organic material layer 160 includes the concavo-convex surface 160a, a shape of the upper surface and/or the lower surface of the first conductive layer 215c arranged on the first organic material layer 160 may correspond to that of the concavo-convex surface 160a of the first organic material layer 160.

As described above, the tension stress may be applied to the first conductive layer 215c when the substrate 100, etc., are bent in the first bending area 1BA in the manufacturing process. Thus, the amount of tension stress applied to the first conductive layer 215c may be reduced by the upper surface and/or the lower surface of the first conductive layer 215c having a shape corresponding to that of the concavo-convex surface 160a of the first organic material layer 160. In other words, the tension stress, which is generated in the bending process, may be reduced via a shape change of the first organic material layer 160 with a lower hardness. In this case, the shape of the first conductive layer 215c, which has the concavo-convex shape at least prior to the bending process, may be changed to correspond to the shape of the first organic material layer 160, which has been changed via the bending. Thus, the occurrence of defects, e.g., a broken wire, in the first conductive layer 215c may be effectively reduced or prevented.

In addition, since the first organic material layer 160 includes a concavo-convex surface 160a at least in a portion of the upper surface (in the +z direction) thereof, a surface area of the upper surface of the first organic material layer 160 and the surface area of the upper and lower surfaces of the first conductive layer 215c in the first opening may be increased. This increase in surface area on the upper surface of the first organic material layer 160 and the upper and lower surfaces of the first conductive layer 215c may provide more room for the shape change to reduce the tension stress due to the bending of the substrate 100, etc.

For reference, since the first conductive layer 215c is arranged on the first organic material layer 160, the lower surface of the first conductive layer 215c may have a shape corresponding to that of concavo-convex surface 160a of the first organic material layer 160. However, the upper surface of the first conductive layer 215c may include its independent concavo-convex surface which does not correspond to the concavo-convex surface 160a of the first organic material layer 160.

For example, the first conductive layer 215c may be formed by forming a conductive material layer on the first organic material layer 160, doping photoresist on the conductive material layer, varying the exposure amount depending on locations of the photoresist via a slit mask or a half-tone mask, developing the photoresist, etching the exposed conductive material layer, and removing the photoresist. Since the exposure amount is different depending on locations of the photoresist by using the slit mask or the half-tone mask, the level of etching may be different depending on locations of the conductive material layer. In this method, the concavo-convex surface on the upper surface of the first conductive layer 215c may be artificially formed. In this case, the upper surface of the first conductive layer 215c may include its independent concavo-convex surface which does not correspond to the concavo-convex surface 160a of the first organic material layer 160. This effect is applied to embodiments and various modifications thereof to be described below. Needless to say, even though such process is performed to artificially form the concavo-convex surface on the upper surface of the first conductive layer 215c, the concavo-convex surface may be formed to correspond to the concavo-convex surface 160a of the first organic material layer 160.

According to another embodiment, when the first organic material layer 160 is formed, particular portions may be relatively more etched (removed) than other portions, by using the photoresist material, and varying the exposure amount via the slit mask or the half-tone mask on various portions of the upper surface of the first organic material layer 160 which are still in approximately a smooth state. In this case, more etched portions may be denoted as concave portions on the upper surface of the first organic material layer 160. However, the manufacturing method of the display apparatus according to an embodiment is not limited thereto.

As described before, the display apparatus is illustrated as un-bent in FIG. 2 for the sake of convenience; however, the substrate 100 of the display apparatus, etc. may actually be in a bent state in the first bending area 1BA, as illustrated in FIG. 1, according to an embodiment. To this effect, the substrate 100 of the display apparatus may be manufactured in approximately a flat state, as illustrated in FIG. 2, in a manufacturing process, and thereafter, the substrate 10, etc. are bent in the first bending area 1BA so that the display apparatus approximately ends up in a shape as illustrated in FIG. 1. In this case, the first conductive layer 215c may receive tension stress in a process of bending the substrate 100, etc. in the first bending area 1BA. However, an occurrence of defects in the first conductive layer 215c in a bending process may be prevented or reduced in the display apparatus according to an embodiment.

When the first inorganic insulating layer, e.g., the buffer layer 110, the gate insulating layer 120, and/or the interlayer insulating layer 130, does not have openings in the first bending area 1BA, but has a continuous shape from the first area 1A to the second area 2A, and the first conductive layer 215c is arranged on the first inorganic insulating layer, high tension stress may be applied to the first conductive layer 215c in the process of bending the substrate 100, etc. Since the hardness of the first inorganic insulating layer is greater than that of the first organic material layer 160, there may be a very high probability that cracks, etc. occur in the first inorganic insulating layer in the first bending area 1BA. Accordingly, when a crack occurs in the first inorganic insulating layer, there may be a very high probability also that the crack, etc. occur in the first conductive layer 215c on the first inorganic insulating layer and defects, e.g., a broken wire, in the first conductive layer 215c occur.

However, in the case of the display apparatus according to an embodiment as described above, the first inorganic insulating layer may include the first opening in the first bending area 1BA, and a portion of the first conductive layer 215c in the first bending area 1BA may be arranged on the first organic material layer 160, which fills at least a portion of the first opening of the first inorganic insulating layer. Since the first inorganic insulating layer includes the first opening in the first bending area 1BA, the probability that cracks, etc., occur in the first inorganic insulating layer may be extremely low. Further, due to characteristics of organic materials used in the first organic material layer 160, the probability of cracks occurring therein is low. Thus, the occurrence of cracks, etc., in the first conductive layer 215c arranged on the first organic material layer 160 in the first bending area 1BA may be reduced or prevented. In addition, since the hardness of the first organic material layer 160 is less than that of the first inorganic insulating layer, the first organic material layer 160 may absorb the tension stress caused by bending of the substrate 100, etc. Thus, the concentration of the tension stress in the first conductive layer 215c may be effectively reduced.

FIGS. 3A through 3C, 4, and 5 are plan views of the first conductive layer 215c arranged in the second area 2A, the first bending area 1BA, and the first area 1A. FIG. 6A is a plan view of the first conductive layer 215c arranged in the second area 2A, the first bending area 1BA, and the first area 1A according to another embodiment, and FIG. 6B is a cross-sectional view of FIG. 6A, taken along a line VI-VP.

Figure 3A:
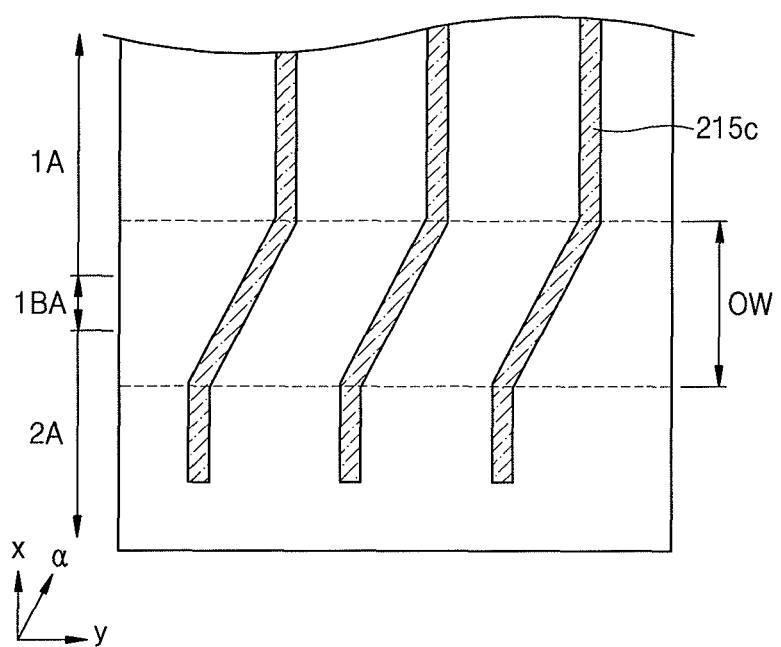
FIG. 3A illustrates a plan view of a first conductive layer arranged in a second area, a first bending area, and a first area according to an embodiment.
Figure 3B:
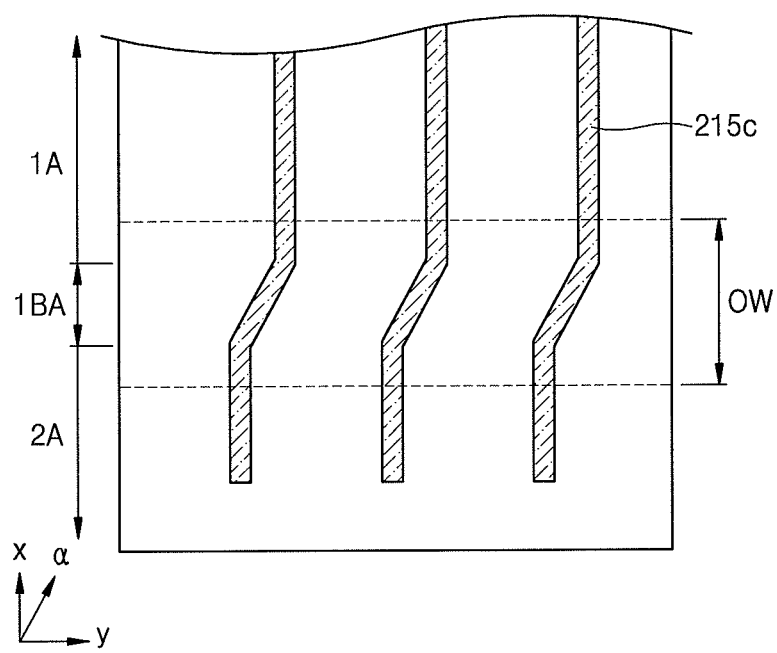
FIG. 3B illustrates a plan view of a first conductive layer arranged in the second area, the first bending area, and the first area according to another embodiment.
Figure 3C:
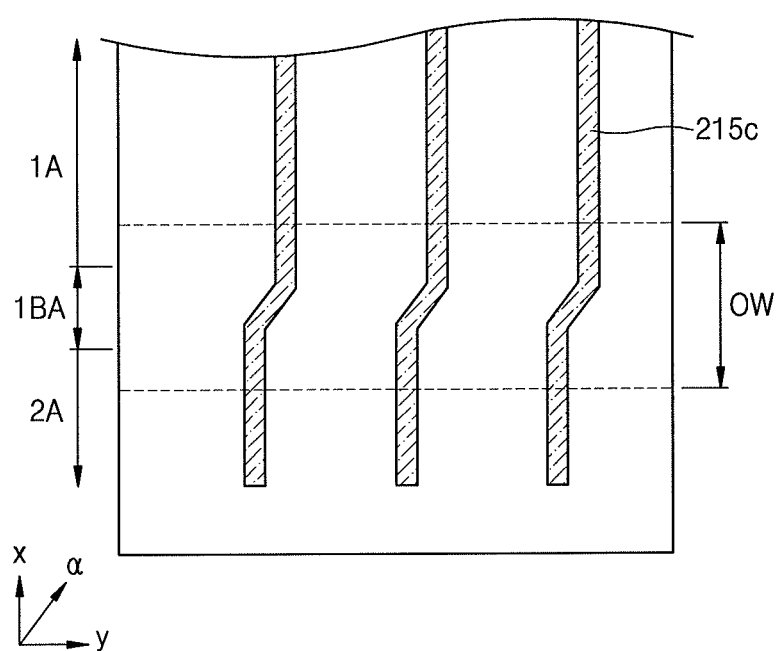
FIG. 3C illustrates a plan view of a first conductive layer arranged in the second area, the first bending area, and the first area according to another embodiment.

According to one or more embodiments, the display apparatus may include a portion of the first conductive layer 215c which extends along a third direction (+α direction) forming an angle of about 0° to about 90° with the first direction (the +y direction), as illustrated in FIGS. 3A through 3C. Another portion of the first conductive layer 215c may extend along the second direction (the +x direction) crossing with the first direction (the +y direction). For example, at least a portion of the first conductive layer 215c may extend in the third direction (the +α direction) forming an angle of about 45° with the first direction (the +y direction).

As illustrated in FIG. 3A, the first conductive layer 215c may extend along the third direction (the +α direction), only in the first opening of the first inorganic insulating layer. The first conductive layer 215c may extend along the second direction (the +x direction) in areas except the first opening.

According to another embodiment, the first conductive layer 215c may extend along the third direction (the +α direction), only in the first bending area 1BA of the first opening, as illustrated in FIG. 3B. The first conductive layer 215c may extend along the second direction (the +x direction) in areas except the first bending area 1BA, that is, in the first area 1A and the second area 2A.

According to another embodiment, the first conductive layer 215c may extend along the third direction (the +α direction), only in at least a portion of the first bending area 1BA, as illustrated in FIG. 3C.

Figure 4:
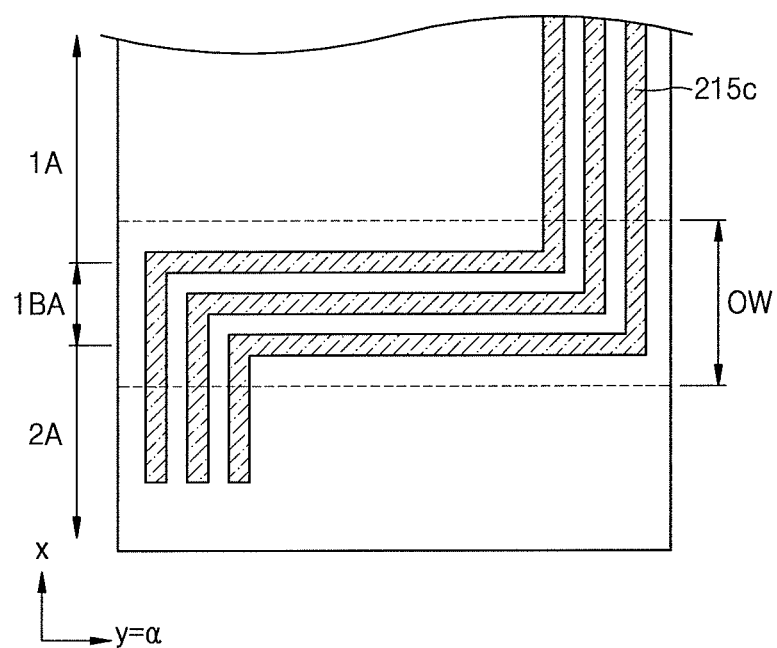
FIG. 4 illustrates a plan view of a first conductive layer arranged in the second area, the first bending area, and the first area according to another embodiment.

When the third direction (the +α direction) forms about 0° with the first direction (the +y direction), as illustrated in FIG. 4, the third direction (the +α direction) may be the same as the first direction (the +y direction), and at least a portion of the first conductive layer 215c may extend in parallel with the first bending axis 1BAX which extends along the first direction (the +y direction).

According to another embodiment, the first conductive layer 215c may extend along the third direction (the +α direction) only in the first bending area 1BA. In other words, the first conductive layer 215c may extend in parallel with the first bending axis 1BAX only in the first bending area 1BA.

Figure 5:
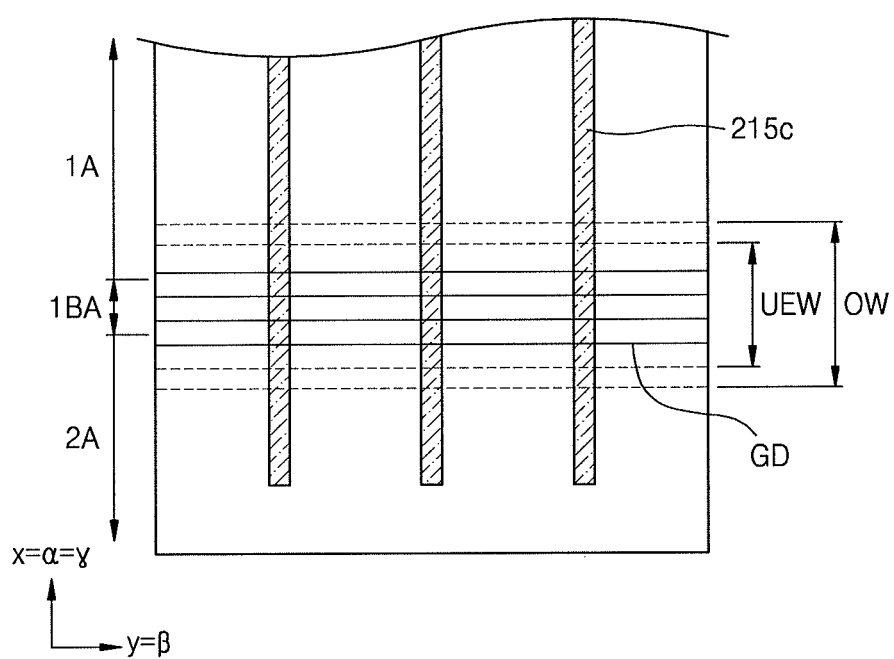
FIG. 5 illustrates a plan view of a first conductive layer arranged in the second area, the first bending area, and the first area according to another embodiment.
Figure 6A:
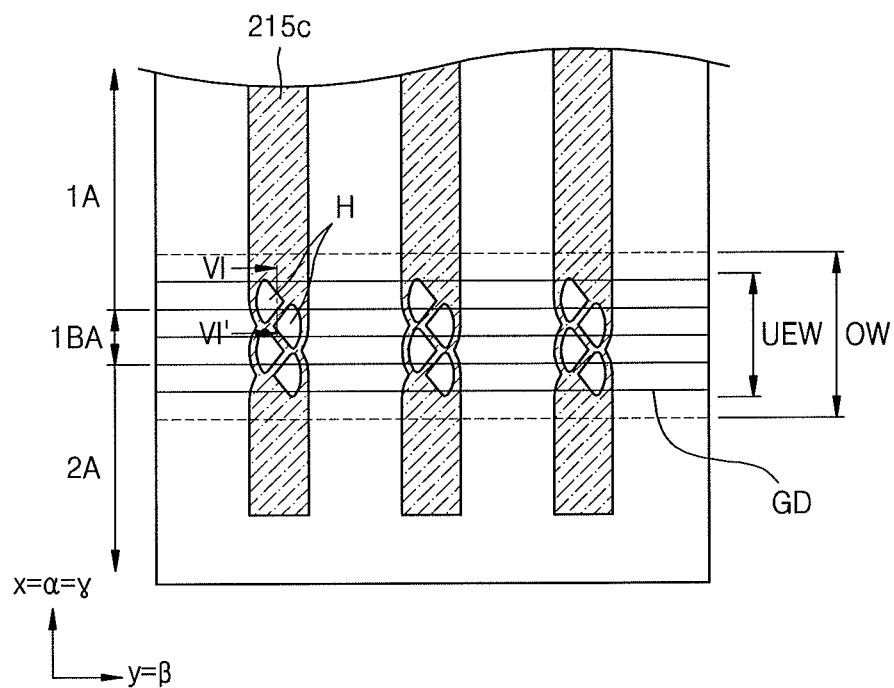
FIG. 6A illustrates a plan view of a first conductive layer arranged in the second area, the first bending area, and the first area according to another embodiment.
Figure 6B:
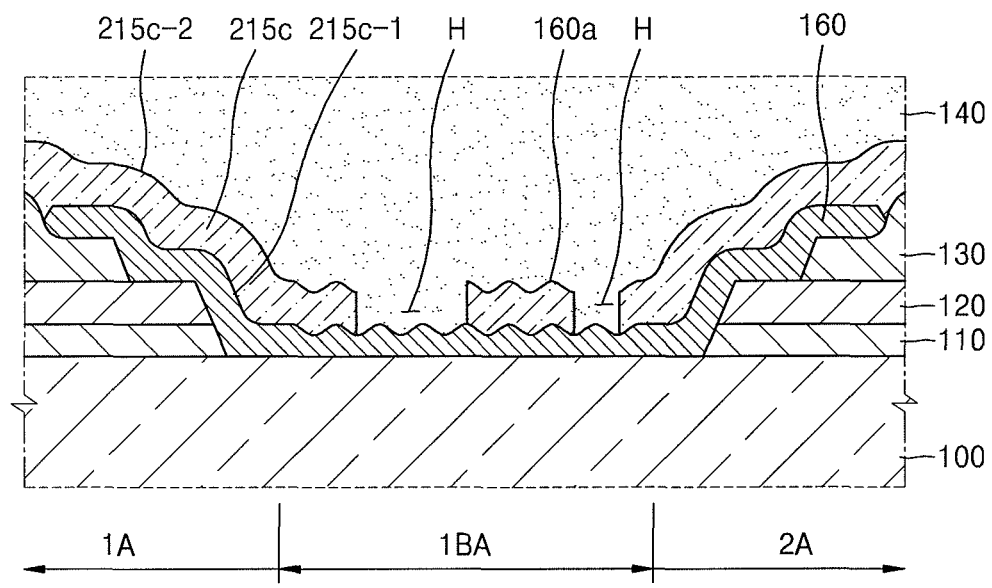
FIG. 6B illustrates a cross-sectional view of FIG. 6A taken along a line VI-VI'.

When the third direction (the +α direction) forms about 90° with the first direction (the +y direction), as illustrated in FIG. 5, the third direction (the +α direction) may be the same as the second direction (the +x direction), and the first conductive layer 215c may extend along the second direction (the +x direction) in the first area 1A, the first bending area 1BA, and the second area 2A. In other word, at least a portion of the first conductive layer 215 c may be perpendicular to the first bending axis 1BAX.

According to an embodiment, as at least a portion of the first conductive layer 215c extends along the third direction (the +α direction) forming an angle of about 0° to about 90° with the first direction (the +y direction), at least a portion of the first conductive layer 215c may be arranged while forming an predetermined angle with the first bending axis 1BAX extended along the first direction (the +y direction).

In addition, since at least a portion of the first conductive layer 215c, which extends along the third direction (the +α direction) while forming a predetermined angle with the first bending axis 1BAX, is arranged in the first bending area 1BA, the occurrence of cracks, etc. in the first bending area 1BA of the first conductive layer 215c may be prevented or the probability of cracks occurring may be reduced.

According to an embodiment, the display apparatus may include at least one hole H in at least a portion of the first conductive layer 215c, as illustrated in FIG. 6A. An arbitrary number and an arbitrary shape of the H in the first conductive layer 215c are illustrated in FIG. 6A; however, the number and the shape of holes H are not limited thereto.

Referring to FIGS. 6A and 6B, the first conductive layer 215c may include a first surface 215c-1 facing the substrate 100, a second surface 215c-2 opposite to the first surface 215c-1, and a plurality of holes H penetrating from the first surface 215c-1 to the second surface 215c-2.

Even though a location of the H in the first conductive layer 215c is not limited, the location may be in the first conductive layer 215c in the first opening according to another embodiment. In addition, according to another embodiment, the holes H may be arranged in the first conductive layer 215c, only at locations corresponding the first bending area 1BA in the first opening, as illustrated in FIG. 6B.

When the holes H are arranged in the first conductive layer 215c at locations corresponding to the first bending area 1BA, the flexibility of the first conductive layer 215c may be improved. In addition, tension stress occurring in the process of bending may be efficiently distributed. Accordingly, occurrence of cracks in the first conductive layer 215c in the first bending area 1BA in the process of bending the substrate 100, etc., in the first bending area 1BA may be reduced or prevented.

An embodiment is illustrated in FIG. 6A where a direction along which the first conductive layer 215c extends (the third direction (the +α direction)) is only perpendicular to the first direction (the +y direction). However, when the first conductive layer 215c extends along the third direction (the +α direction) forming an predetermined angle with the first direction (the +y direction), the first conductive layer 215c may include the plurality of holes H, which penetrate from the first surface 215c-1 to the second surface 215c-2, in a portion of the first conductive layer 215c, regardless of the extension direction.

In addition, when the first conductive layer 215c extends along the third direction (the +α direction) forming an predetermined angle with the first direction (the +y direction), the first conductive layer 215c may include holes H only in the first opening or only in the first bending area 1BA, regardless of the extension direction.

Referring to FIGS. 2 and 5, the first organic material layer 160 may include a plurality of protrusions on the upper surface (in the +z direction) to form the concavo-convex surface 160a on the upper surface (in the +z direction) of the first organic material layer 160. In this case, the plurality of protrusions may be respectively formed with a plurality of protrusion axes (GD) which extend along a fourth direction (α+β direction) forming an angle of about 0° to about 90° with the first direction (the +y direction) as centers. In other words, the concavo-convex surface 160a may include the plurality of protrusions in a fifth direction (α+γ direction) perpendicular to the fourth direction (the +β direction). The protrusion axes described below denote axes on which the protrusion centers are arranged, and each of the plurality of protrusions may be formed with one protrusion axis as the center. Below, one protrusion axis may be the center of one protrusion. Detailed description on the fourth direction (the +β direction) along which the plurality of protrusion axes are extended and the plurality of protrusions which are formed with respective protrusion axes as centers will be provided below.

Referring again to FIG. 2, the first organic material layer 160 may include the concavo-convex surface 160a only in the first opening of the first inorganic insulating layer. As illustrated in FIG. 2, the width (UEW) of a portion in which the concavo-convex surface 160a of the first organic material layer 160 may be narrower than the width (OW) of the first opening of the first inorganic insulating layer. In the concavo-convex surface 160a of the first organic material layer 160, a concave portion of the concavo-convex surface 160a may be relatively thinner than a convex portion.

Figure 7:
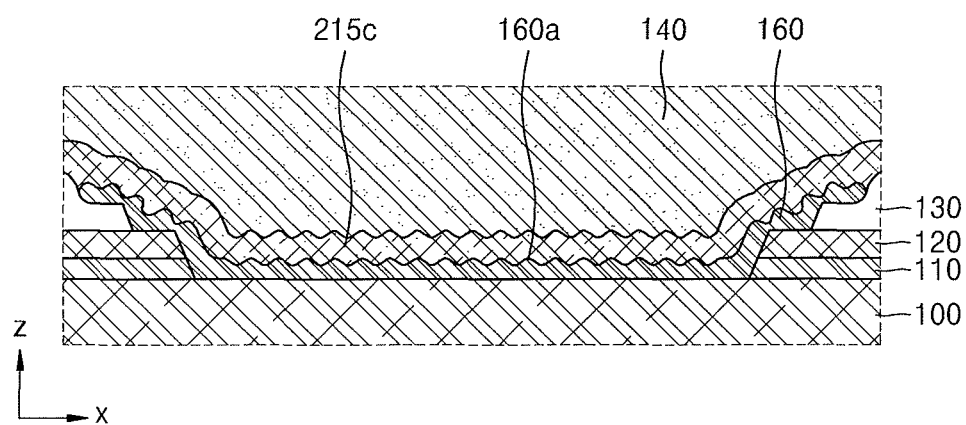
FIG. 7 illustrates a cross-sectional view of a portion of a display apparatus according to a comparative example.

As illustrated in FIG. 7, according to a comparative example, when the concavo-convex surface 160a extends beyond the first opening of the first inorganic insulating layer, e.g., is arranged on the inner side surface of the opening 110a of the buffer layer 110, on the inner side surface of the opening 120a of the gate insulating layer 120, and/or around the inner side surface of the opening 130a of the interlayer insulating layer 130, as illustrated in FIG. 7, the first organic material layer 160 may not be continuously connected, i.e., may by discontinuous or broken, e.g., due to the thinner concave portion. Accordingly, this break in the first organic material layer 160 may be reduced or prevented by having the concavo-convex surface 160a only in the first opening of the first inorganic insulating layer.

As described above, it is desirable that the first organic material layer 160 includes the concavo-convex surface 160a in the first bending area 1BA to prevent the occurrence of a broken wire, etc. of the first conductive layer 215c in the first bending area 1BA. Accordingly, the area of the concavo-convex surface 160a of the first organic material layer 160 may be greater than that of the first bending area 1BA but may be smaller than that of the first opening. It is illustrated in FIG. 2 that the UEW of the portion in which the first organic material layer 160 includes the concavo-convex surface 160a is greater than that of the first bending area 1BA and smaller than the OW of the first opening.

The concavo-convex surface 160a of the upper surface (in the +z direction) of the first organic material layer 160 may be formed via various methods. According to another embodiment, the concavo-convex surface 160a may be formed on the upper surface of the first organic material layer 160 via a thermal reflow process. In other words, a smooth concavo-convex surface 160a may be formed on the upper surface of the first organic material layer 160 by depositing organic material, heating and patterning. As the smooth concavo-convex surface 160a is formed on the upper surface of the first organic material layer 160 via the thermal reflow process, an advantageous effect may result in that the first organic material layer more flexibly absorbs the tension stress of the first conductive layer 215c in the bending process. A method to form the concavo-convex surface 160a on the upper surface (in the +z direction) of the first organic material layer 160 is not limited thereto, and the concavo-convex surface 160a may be formed in various methods.

Figure 8:
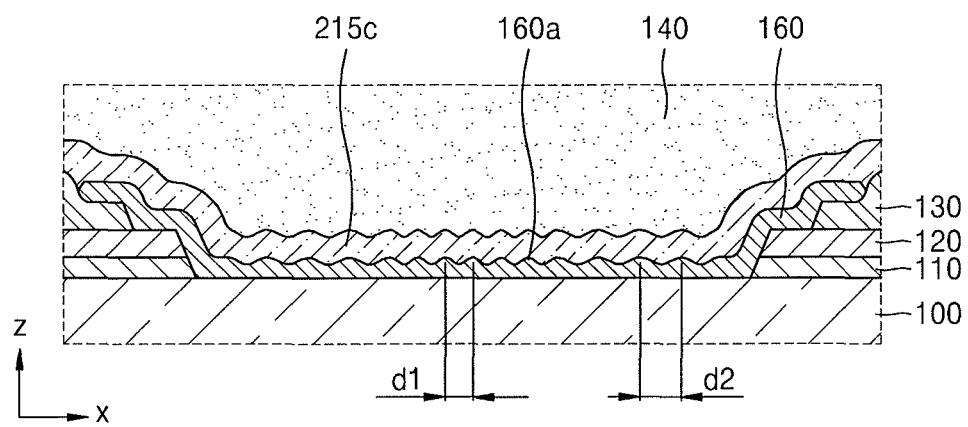
FIG. 8 illustrates a cross-sectional view of a portion of a display apparatus, in detail, around a first opening of a first inorganic insulating layer according to another embodiment.

FIG. 8 is a cross-sectional view of a portion of the display apparatus, i.e., a detailed cross-sectional view around the first opening of the first inorganic insulating layer according to another embodiment. As noted above, the concavo-convex surface 160a of the first organic material layer 160 may include, as described above, the plurality of protrusion axes that extend along the fourth direction (the +β direction) forming an angle of about 0° to about 90° with the first direction (the +y direction) and the plurality of protrusions formed with respective protrusion axes as centers. Here, a distance d1 between the plurality of protrusion axes at the central portion of the first opening may be shorter than a distance d2 between the plurality of protrusion axes in other portions of the first opening.

As described above with reference to FIG. 1, the substrate 100, etc., of the display apparatus may be bent with the first bending axis 1BAX which extends along the first direction (the +y direction) as the center according to an embodiment. Accordingly, the substrate 100, the first organic material layer 160, the first conductive layer 215c, etc. may be bent in the first bending area BA1. In this case, the biggest tension stress may be applied to the central portion of the first bending area 1BA, i.e., the central portion of the first opening. Thus, when the distance d1 between the plurality of protrusion axes at the central portion of the first opening is shorter than the distance d2 between the plurality of protrusion axes in other portions of the first opening, the surface area of the upper surface of the first organic material layer 160 at the central portion of the first opening and the surface area of the upper and lower surfaces of the first conductive layer 215c at the central portion of the first opening may be relatively greater than the surface area in other portions of the first opening. This indicates that the upper surface of the first organic material layer 160 and on the upper and lower surfaces of the first conductive layer 215c may have more room for the shape change to reduce the tension stress due to the bending of the substrate 100, etc. A location on which distances between the plurality of protrusion axes change from the distance d1 to the distance d2 may be in the first bending area 1BA.

Distances between the plurality of protrusion axes may be different from the distance d1 or the distance d2 at the central portion of the first opening or at other portions not adjacent to edges in the first opening. In addition, the distances between the plurality of protrusion axes may progressively increase as the locations thereof move from the central portion of the first opening toward edges of the first opening. This effect may be applied to embodiments and various modifications thereof to be described below.

Figure 9:
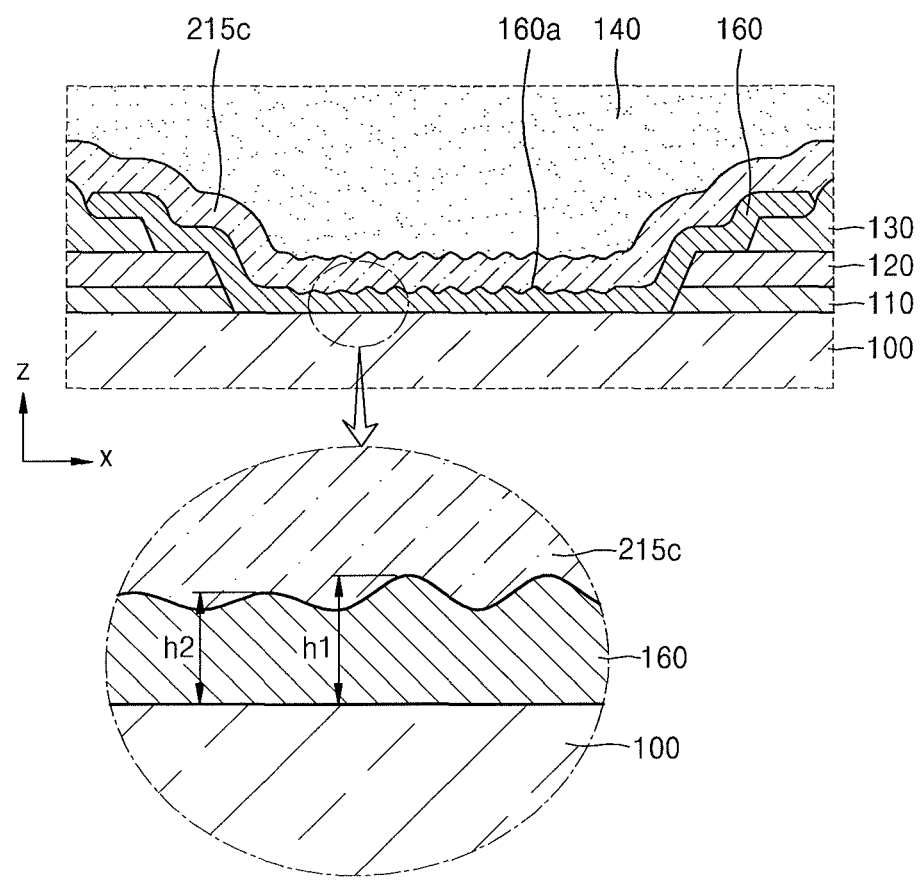
FIG. 9 illustrates a cross-sectional view of a portion of a display apparatus, in detail, around the first opening of the first inorganic insulating layer according to another embodiment.

FIG. 9 is a cross-sectional view of a portion of the display apparatus, i.e., a detailed cross-sectional view around the first opening of the first inorganic insulating layer according to another embodiment. As shown therein, the concavo-convex surface 160a of the first organic material layer 160 may include, as described above, the plurality of protrusion axes that extend along the fourth direction (the +β direction) forming an angle of about 0° to about 90° with the first direction (the +y direction) and the plurality of protrusions formed with respective protrusion axes as centers. In this case, a height h1 from the upper surface of the substrate 100 to the plurality of protrusions at the central portion of the first opening may be greater than a height h2 from the upper surface of the substrate 100 to the plurality of protrusions at other portions of the first opening.

As described above with reference to FIG. 1, the substrate 100, etc., of the display apparatus may be bent with the first bending axis 1BAX which extends along the first direction (the +y direction) as the center according to an embodiment. Accordingly, the substrate 100, the first organic material layer 160, and the first conductive layer 215c, etc. may be bent in the BA. In this case, the biggest tension stress may be applied to the central portion of the first bending area 1BA, that is, the central portion of the first opening. Thus, the surface area of the upper surface of the first organic material layer 160 at the central portion of the first opening and the surface area of the upper and lower surfaces of the first conductive layer 215c at the central portion of the first opening may be relatively greater than the surface area in other portions of the first opening, by forming the height h1 from the upper surface of the substrate 100 to the plurality of protrusions at the central portion of the first opening be greater than the height h2 from the upper surface of the substrate 100 to the plurality of protrusions at other portions of the first opening. This indicates that the upper surface of the first organic material layer 160 and on the upper and lower surfaces of the first conductive layer 215c may have more room for the shape change to reduce the tension stress due to the bending of the substrate 100, etc. A location on which the heights from the upper surface of the substrate 100 to the plurality of protrusions change from the height h1 to the height h2 may be in the first bending area 1BA.

The heights from the upper surface of the substrate 100 to the plurality of protrusions may be different from the height h1 or the height h2 at the central portion of the first opening or at other portions not adjacent to edges in the first opening. In addition, the heights from the upper surface of the substrate 100 to the plurality of protrusions may decrease as the locations thereof move from the central portion of the first opening toward edges of the first opening. This effect may be applied to embodiments and various modifications thereof to be described below.

Figure 10:
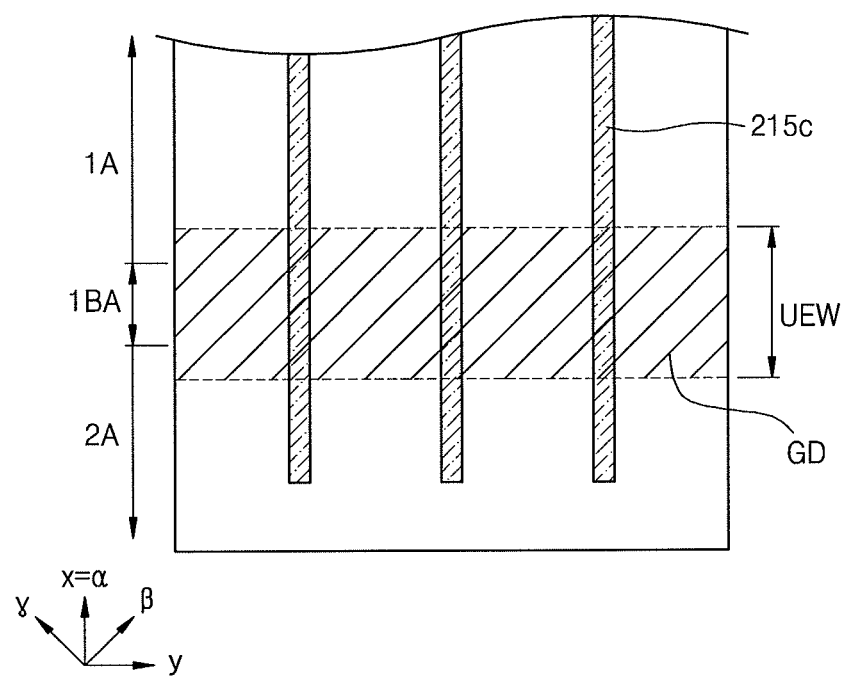
FIG. 10 illustrates a plan view of a first conductive layer and a plurality of protrusion axes which are arranged in the first area, the first bending area, and the second area according to an embodiment.
Figure 11:
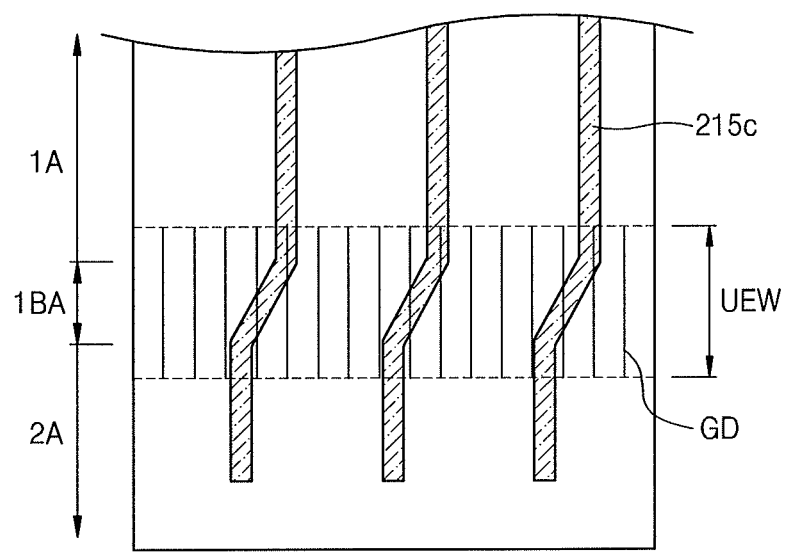
FIG. 11 illustrates a plan view of a first conductive layer and a plurality of protrusion axes which are arranged in the first area, the first bending area, and the second area according to another embodiment.
Figure 12:
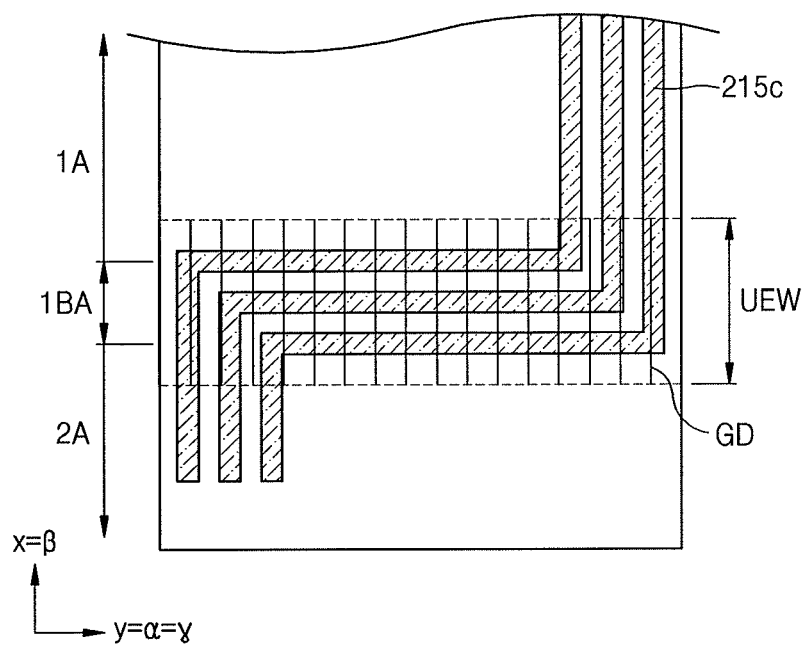
FIG. 12 illustrates a plan view of a first conductive layer and a plurality of protrusion axes which are arranged in the first area, the first bending area, and the second area according to another embodiment.

FIGS. 10 through 12 are plan views of the first conductive layer 215c and the plurality of protrusion axes GD arranged in the second area 2A, the first bending area 1BA, and the first area 1A. Below, directions along which the first bending axis 1BAX, the first conductive layer 215c, and the protrusion axes GD will be described with reference to FIGS. 2, 5, and 10 through 12.

As described above, the concavo-convex surface 160a on the upper surface (in the +z direction) of the first organic material layer 160 may be have the UEW, which is wider than the first bending area 1BA, but narrower than that of the first opening. The concavo-convex surface 160a may include the plurality of protrusions which are formed with the plurality of protrusion axes GD as centers, and the plurality of protrusion axes GD may extend along the fourth direction (the +β direction) forming an angle of about 0° to about 90° with the first direction (the +y direction). Accordingly, the concavo-convex surface 160a may include the plurality of protrusions in the fifth direction (the +γ direction) perpendicular to the fourth direction (the +β direction).

As illustrated in FIG. 5, the first conductive layer 215c may extend along the third direction (the +α direction) forming an angle of about 90° with the first direction (the +y direction), and the plurality of protrusion axes GD may extend along the fourth direction (the +β direction) forming an angle of about 0° with the first direction (the +y direction). In other words, the first conductive layer 215c may extend along a direction perpendicular to the first bending axis 1BAX, and the plurality of protrusion axes GD may extend in a direction in parallel with the first bending axis 1BAX. In addition, the concavo-convex surface 160a may include the plurality of protrusions formed with the plurality of protrusion axes GD as centers, in the fifth direction (the +γ direction) perpendicular to the fourth direction (the +β direction).

As a result, according to an embodiment, the plurality of protrusion axes GD may be formed in a direction perpendicular to the first conductive layer 215c, and the concavo-convex surface 160a may include the plurality of protrusions formed with the plurality of protrusion axes GD as centers in a direction in parallel with the first conductive layer 215c.

As illustrated in FIG. 10, the first conductive layer 215c may extend along the third direction (the +α direction) forming an angle of about 90° with to the first direction (the +y direction), and the plurality of protrusion axes GD may extend along the fourth direction (the +β direction) forming a predetermined angle (for example, about +45°) with the first direction (the +y direction). In other words, the first conductive layer 215c may extend along a direction perpendicular to the first bending axis 1BAX, and the plurality of protrusion axes GD may be formed with an inclination of an predetermined angle (for example, about +45°) with the first conductive layer 215c. In this case, the concavo-convex surface 160a may include the plurality of protrusions formed with the plurality of protrusion axes GD along the fifth direction (the +γ direction) perpendicular to the fourth direction (the +β direction) along which the plurality of protrusion axes GD are extended as illustrated in FIG. 10.

As illustrated in FIG. 11, at least a portion of the first conductive layer 215c may extend along the third direction (the +α direction) forming an predetermined angle (for example, about +45°) with the first direction (the +y direction), and the plurality of protrusion axes GD may extend along the fourth direction (the +β direction) forming an angle of about 90° with the first direction (the +y direction).

According to another embodiment, the first conductive layer 215c may extend along the third direction (the +α direction) in the first bending area 1BA, and the plurality of protrusion axes GD may be arranged with a certain angle from the first conductive layer 215c in a portion in which the first conductive layer 215c extends along the third direction (the +α direction). The portion in which the first conductive layer 215c extends along the third direction (the +α direction) is not limited thereto, and the first conductive layer 215c may extend along the third direction (the +α direction) within the UEW.

As illustrated in FIG. 12, at least a portion of the first conductive layer 215c may extend along the third direction (the +α direction) forming an angle of about 0° with the first direction (the +y direction), and the plurality of protrusion axes GD may extend along the fourth direction (the +β direction) forming an angle of about 90° with the first direction (the +y direction). In other words, at least a portion of the first conductive layer 215c may extend parallel with the first direction (the +y direction), and the plurality of protrusion axes GD may extend perpendicular to the first direction (the +y direction). As a result, the plurality of protrusion axes GD may be formed in a direction perpendicular to at least a portion of the first conductive layer 215c, and the concavo-convex surface 160a may include the plurality of protrusions formed with the plurality of protrusion axes GD as centers along the fifth direction (the +γ direction) in parallel with the first direction (the +y direction).

According to an embodiment, the display apparatus may include at least a portion of the first conductive layer 215c extends in the first bending area 1BA along the third direction (the +α direction) forming an angle of about 0° to about 90° with the first direction (the +y direction) along which the first bending axis 1BAX extends. Thus, a contact area between the lower surface of the first conductive layer 215c and the first organic material layer 160 may be increased, which may reduce or prevent cracks in the first conductive layer 215c from being formed due to the bending process.

In addition, the first conductive layer 215c may extend along the third direction (the +α direction) and the plurality of protrusion axes GD forming the concavo-convex surface 160a may extended along the fourth direction (the +β direction) forming an angle of about 0° to about 90° with the first direction (the +y direction). Thus, the tension stress applied to the first conductive layer 215c during the bending may be efficiently reduced. In addition to embodiments described above, the display apparatus may include a first direction along which the first bending axis 1BAX extends as a negative y direction (a−y direction) forming an angle of about 180° with the first direction (the +y direction). In other words, since the first direction is a direction along which the first bending axis 1BAX extends, the first direction may include not only the first direction (the +y direction) described above, but also the −y direction forming an angle of about 180° with the first direction (the +y direction).

Thus, according to another example, at least a portion of the first conductive layer 215c may extend along the third direction (the +α direction) forming an angle of about 0° to about 90° with the first direction (the −y direction) along which the first bending axis 1BAX extends. According to another example, the plurality of protrusion axes GD forming the concavo-convex surface 160a may also be extended along the fourth direction (the +β direction) forming an angle of about 0° to about 90° with the first direction (the −y direction).

Figure 13:
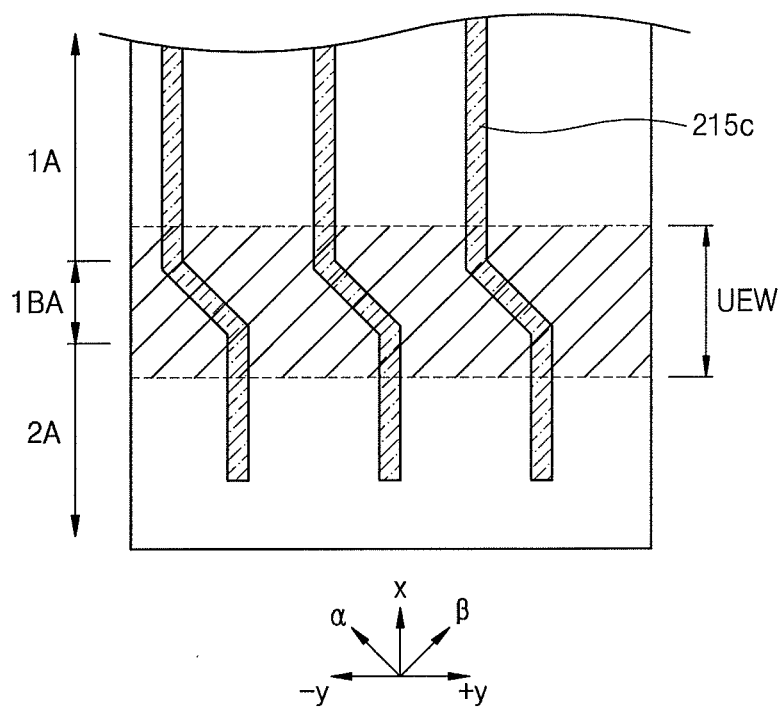
FIG. 13 illustrates a plan view of a first conductive layer and a plurality of protrusion axes which are arranged in the first area, the first bending area, and the second area according to another embodiment.

As illustrated in FIG. 13, the display apparatus according to an embodiment may include at least a portion of the first conductive layer 215c extending in the first bending area 1BA along the third direction (the +α direction) forming an angle of about 45° with the first direction (the −y direction) along which the first bending axis 1BAX extends. In addition, the plurality of protrusion axes GD forming the concavo-convex surface 160a may extend along the fourth direction (the +β direction) forming an angle of about 45° with the first direction (the +y direction).

Figure 14:
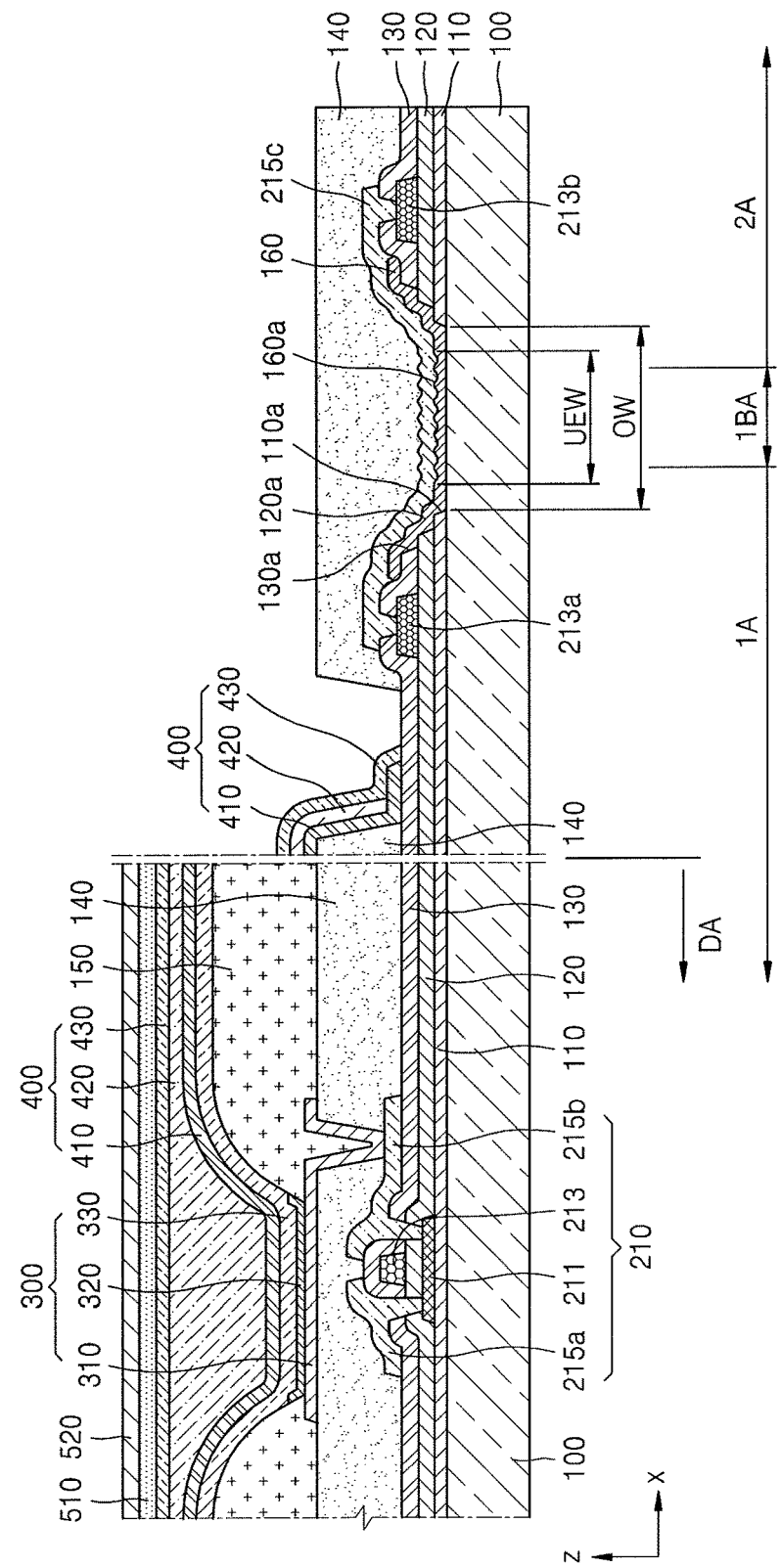
FIG. 14 illustrates a cross-sectional view of a portion of a display apparatus according to another embodiment.

FIG. 14 is a cross-sectional view of a portion of the display apparatus according to another embodiment. Like reference numbers denote like components in FIG. 14, as in FIG. 2, and duplicate descriptions will be omitted for the sake of simplicity.

As illustrated in FIG. 14, regarding the area of the first opening formed on the first inorganic insulating layer, the area of the opening 120a of the gate insulating layer 120 may be greater than that of the opening 110a of the buffer layer 110. In this case, the area of the first opening may be defined as the area of the opening with the smallest area among the openings 110a, 120a, and 130a of the buffer layer 110, the gate insulating layer 120, and the interlayer insulating layer 130, respectively, i.e., that of the opening 110a.

According to another example, the first opening of the first inorganic insulating layer may not completely penetrate through in a vertical direction at the location corresponding to the first bending area 1BA, and the buffer layer 110 may be continuously formed through the first area 1A, the first bending area 1BA, and the second area 2A. In other words, the buffer layer 110 may be continuously formed, and the gate insulating layer 120 and the interlayer insulating layer 130 only may respectively include the opening 120a in the first bending area 1BA and the opening 130a corresponding to the first bending area 1BA.

The first inorganic insulating layer may include the first opening with various configurations different from this configuration. In other words, various modifications may be possible such that a portion only of the upper surface (in the +z direction) of the buffer layer 110 is removed, or the first opening is formed while the bottom surface (a−z direction) of the gate insulating layer 120 is not removed, i.e., remains.

Figure 15:
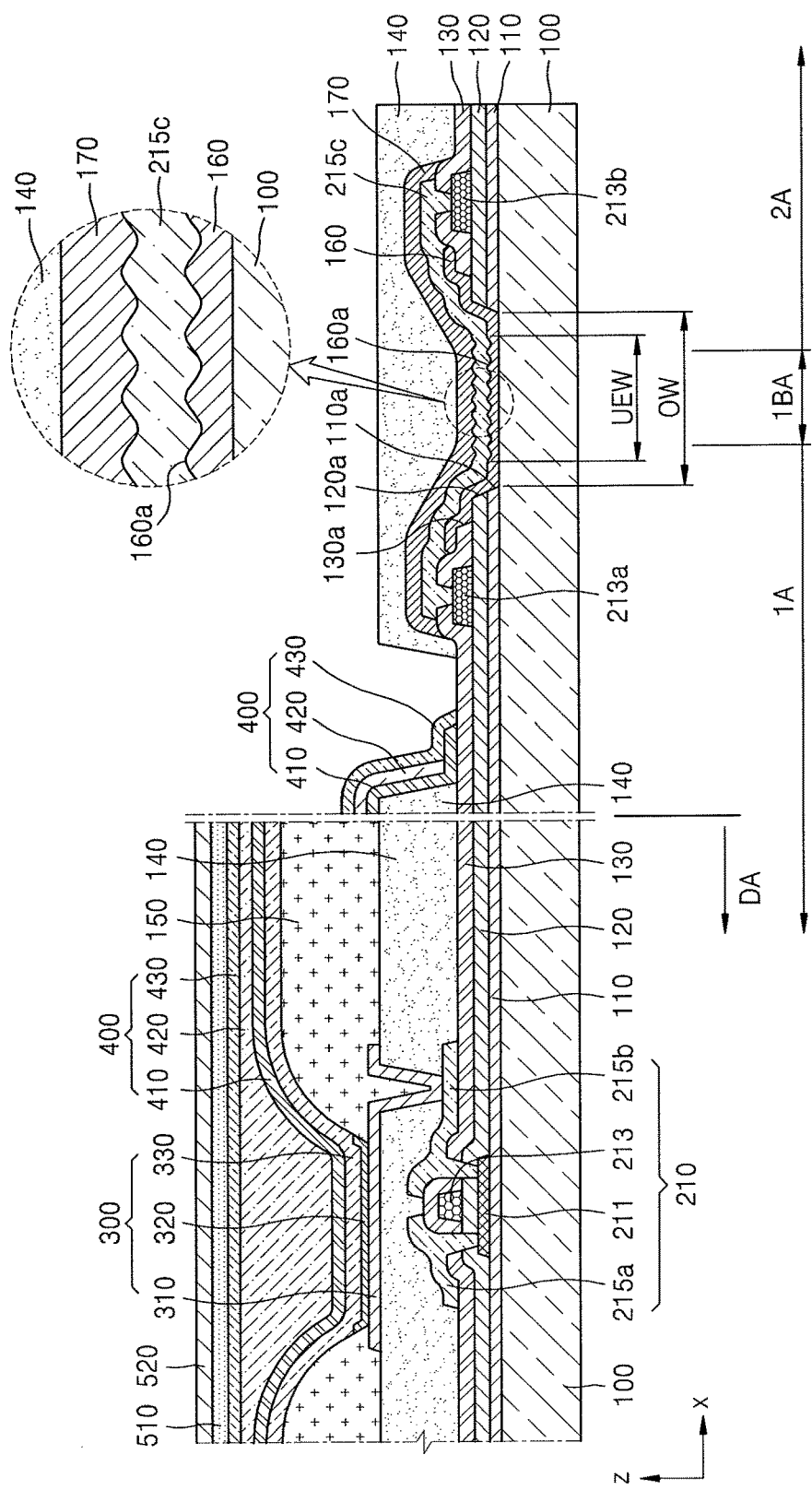
FIG. 15 illustrates a cross-sectional view of a portion of a display apparatus according to another embodiment.

FIG. 15 is a cross-sectional view of a portion of a display apparatus according to another embodiment. Like reference numbers denote like components in FIG. 15, as in FIG. 2, and duplicate descriptions will be omitted for the sake of simplicity. According to an embodiment, the display apparatus may include a second organic material layer 170 prior to an arrangement of the planarization layer 140 on the first conductive layer 215c.

According to another embodiment, the second organic material layer 170 may completely cover the first conductive layer 215c with either the same material as or a different material from the first organic material layer 160. In addition, the second organic material layer 170 may completely cover the first opening, like the first organic material layer 160. However, the embodiments are not limited thereto and the second organic material layer 170 may be formed in the first opening or at a location corresponding to the first bending area 1BA only.

The second organic material layer 170 may have a low probability of the crack occurrence due to characteristics of an organic material used therein. Accordingly, the occurrence of cracks, etc., in a portion of the first bending area 1BA of the first conductive layer 215c that is between the first organic material layer 160 and the second organic material layer 170 during the bending process may be reduced or prevented.

In addition, since the hardness of the second organic material layer 170 is less than that of the inorganic material layer, the second organic material layer 170 and the first organic material layer 160 may absorb the tension stress caused by the bending of the substrate 100, etc., and the concentration of the tension stress onto the first conductive layer 215c may be effectively reduced.

Figure 16:
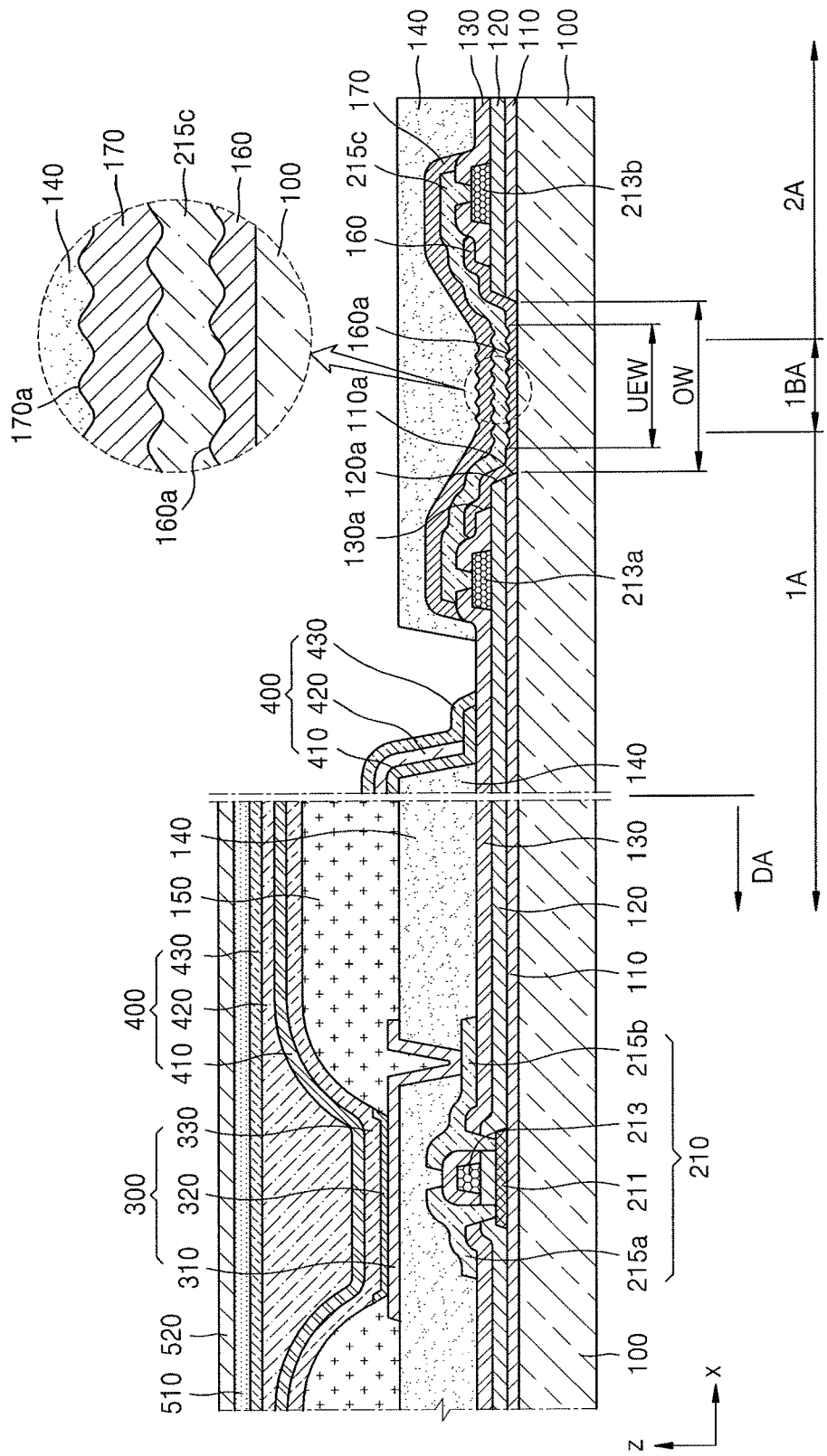
FIG. 16 illustrates a cross-sectional view of a portion of a display apparatus according to another embodiment.

FIG. 16 is a cross-sectional view of a portion of a display apparatus according to another embodiment. Like reference numbers denote like components in FIG. 16, as in FIG. 2, and duplicate descriptions will be omitted for the sake of simplicity. As illustrated in FIG. 16, the second organic material layer 170 may be arranged prior to the arrangement of the planarization layer 140 on the first conductive layer 215c, and the second organic material layer 170 may include a concavo-convex surface 170a on at least a portion of the upper surface (in the +z direction) thereof.

According to another embodiment, the concavo-convex surface 170a may correspond to at least the first bending area 1BA, and may have a larger area than the first bending area 1BA. According to another embodiment, the concavo-convex surface 170a of the second organic material layer 170 may have a shape corresponding to that of the concavo-convex surface 160a of the first organic material layer 160. However, this is one embodiment only, and the concavo-convex surface 170a of the second organic material layer 170 may be formed in various shapes, regardless of the shape of the concavo-convex surface 160a of the first organic material layer 160. In other words, the concavo-convex surface 170a of the second organic material layer 170 may be formed in a different cycle from that of the concavo-convex surface 160a of the first organic material layer 160, and the concavo-convex surface 170a of the second organic material layer 170 may approximately correspond to the concavo-convex surface 160a of the first organic material layer 160.

As described above, according to an embodiment, since the first organic material layer 160 and the second organic material layer 170 are respectively arranged on the bottom surface and the upper surface of the first conductive layer 215c, and the second organic material layer 170 and the first organic material layer 160 absorb the tension stress caused by the bending of the substrate 100, etc., as a result, the concentration of the tension stress onto the first conductive layer 215c may be effectively reduced.

In addition, as illustrated in FIG. 16, since the concavo-convex surface 170a of the second organic material layer 170 is formed in a shape corresponding to that of the concavo-convex surface 160a of the first organic material layer 160 on the upper surface of the second organic material layer 170, the tension stress is applied to the first conductive layer 215c in the first bending area 1BA in the bending process of the substrate 100, etc., may be reduced. Thus, the occurrence of defects in the first conductive layer 215c may be prevented or reduced.

The second organic material layer 170 may include a plurality of protrusions on the upper surface (in the +z direction) thereof to have the concavo-convex surface 170a. In this case, the plurality of protrusions may be formed with a plurality of protrusion axes, which are extended along a sixth direction ($\alpha+\delta$ direction) forming an angle of about 0° to about 90° with the first direction (the +y direction), as centers. In other words, the concavo-convex surface 170a may include the plurality of protrusions in a direction perpendicular to the sixth direction (the +$\delta$ direction).

Even though the sixth direction (the +$\delta$ direction) is not illustrated in a drawing, the sixth direction (the +$\delta$ direction) may be an predetermined direction forming an angle of about 0° to about 90° with the first direction (the +y direction), and may be the same as or different from the fourth direction (the +$\beta$ direction), along which the protrusion axes extend, on the concavo-convex surface 160a of the first organic material layer 160.

In other words, the direction (the fourth direction (the +$\beta$ direction)) along which the plurality of protrusion axes are formed on the concavo-convex surface 160a of the first organic material layer 160 may be the same as or different from the direction (the sixth direction (the +$\delta$ direction)) along which the plurality of protrusion axes are formed on the concavo-convex surface 170a of the first organic material layer 170.

According to an embodiment, the second organic material layer 170 including the concavo-convex surface 170a of the display apparatus may be formed with organic materials via various methods.

According to another embodiment, the concavo-convex surface 170a of may be formed on the upper surface of the second organic material layer 170 by using the same organic material as the concavo-convex surface 160a of the first organic material layer 160, and the thermal reflow process. In other words, a smooth concavo-convex surface 170a may be formed on the upper surface of the second organic material layer 170 by depositing the photoresist material, heating, and patterning.

According to another embodiment, the plurality of protrusions may be formed on the upper surface of the second organic material layer 170 by applying the organic material via an inkjet printing method, a jetting method, a dotting method, etc., and by hardening via an irradiation of ultraviolet rays.

According to an embodiment, the display apparatus may include the plurality of protrusion axes extending along various directions, the first organic material layer 160 and the second organic material layer 170 including the plurality of protrusions formed with the plurality of protrusion axes as centers, and the first conductive layer 215c that extends along various directions. Thus, the tension stress caused by the bending may be distributed and as a result, the concentration of the tension stress may be effectively reduced.

Figure 17:
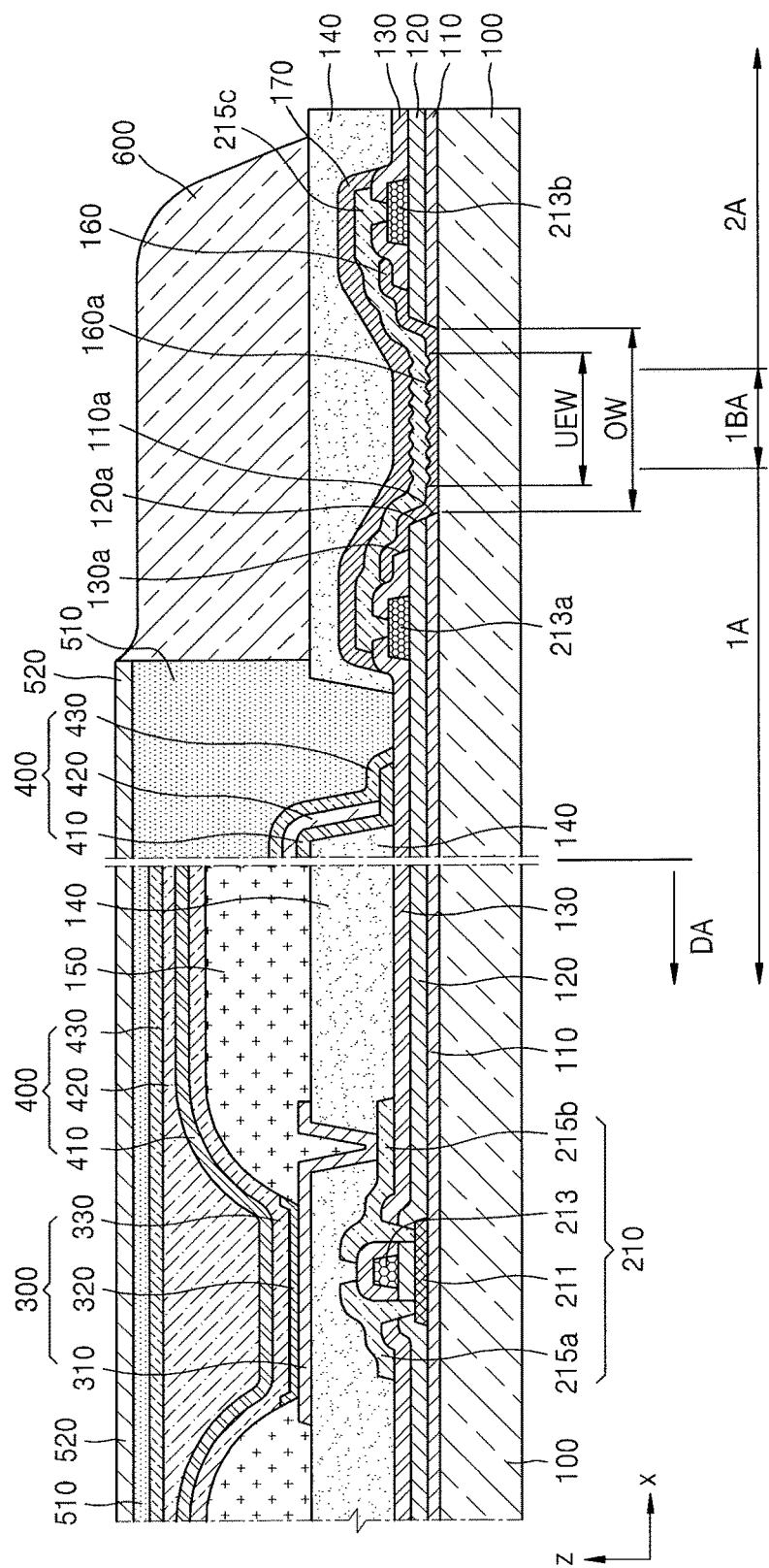
FIG. 17 illustrates a cross-sectional view of a portion of a display apparatus according to another embodiment.

FIG. 17 is a cross-sectional view of a portion of a display apparatus according to another embodiment. Like reference numbers denote like components in FIG. 17, as in FIGS. 2 and 5, and duplicate descriptions will be omitted for the sake of simplicity.

According to an embodiment, the display apparatus may include a polarizing plate 520 arranged on an encapsulating layer 400 via an optically clear adhesive (OCA) 510. The polarizing plate 520 may reduce a reflection of outside light. For example, when the outside light transmitted through the polarizing plate 520 is reflected on an upper surface of the counter electrode 330 and passes through the polarizing plate 520 again, a phase of the outside light may be changed due to passing through the polarizing plate 520 for two times. As a result, the phase of the reflected light may become different from that of the outside light entering the polarizing plate 520, resulting in destructive interference. Thus, the reflection of the outside light may be reduced and a visibility may be improved.

The OCA 510 and the polarizing plate 520 may cover, for example, the opening of the planarization layer 140, as illustrated in FIG. 15. The display apparatus according to an embodiment may not necessarily include the polarizing plate all the time, and the polarizing plate 520 may be omitted or replaced by other components when needed. For example, the outside reflection may be reduced by omitting the polarizing plate 520, and using a black matrix and a color filter.

A stress neutralization layer (SNL) 600 may be arranged outside the display area DA. In other words, the SNL 600 may be arranged on the first conductive layer 215c at least to correspond to the first bending area 1BA.

When a laminated structure is bent, a stress neutral plane may exist inside the laminated structure. If the SNL 600 is omitted, an excessive tension stress, etc., may be applied to the first conductive layer 215c in the first bending area 1BA due to the bending of the substrate 100, etc., because the location of the first conductive layer 215c may not correspond to that of the stress neutral plane. However, the location of the stress neutral plane may be adjusted in the laminated structure, which includes all of the substrate 100, the first conductive layer 215c, the SNL 600, etc. by controlling characteristics of the SNL 600, e.g., a thickness, an elastic modulus, etc., thereof. Accordingly, the tension stress applied to the first conductive layer 215c may be reduced by arranging the stress neutral plane be arranged around the first conductive layer 215c via the SNL 600.

The SNL 600 may extend to ends of the edges of the substrate 100 of the display apparatus. For example, in the second area 2A, the first conductive layer 215c, the second conductive layers 213a and 213b and/or other conductive layers electrically connected therefrom, etc. may, without having at least a portion thereof be covered by the interlayer insulating layer 130, the planarization layer 140, etc., be electrically connected to various electronic devices, printed circuit boards, etc. Accordingly, the first conductive layer 215c, the second conductive layers 213a and 213b and/or other conductive layers electrically connected therefrom may have portions which are electrically connected to various electronic devices, printed circuit boards, etc., each other. In this case, electrically connected portions need to be protected from impurities such as outside moisture, and the SNL 600 may serve as a protection layer by having such electrically connected portions covered by the SNL 600. For this purpose, the SNL 600 may extend, for example, to ends of the edges of the substrate 100 of the display apparatus.

The upper surface of the SNL 600 in a direction of the display area DA (a−x direction) is illustrated as to coincide with the upper surface of the polarizing plate 520 (in the +z direction) in FIG. 17; however, embodiments are not limited thereto. For example, the edge of the SNL 600 in the direction of the display area DA (the −x direction) may cover a portion of the upper surface at the edge of the polarizing plate 520. Alternatively, the edge of the SNL 600 in the direction of the display area DA (the −x direction) may not contact the polarizing plate 520 and/or the OCA 510. Especially, in the latter case, a movement of a gas, which is generated in the SNL 600 during or after the forming of the SNL 600 in the direction of the display area DA (the −x direction), may be prevented from causing a deterioration of the display devices such as the OLED and etc.

When the upper surface of the SNL 600 in the direction of the display area DA (the −x direction) coincides with the upper surface of the polarizing plate 520 (the +z direction) as illustrated in FIG. 17, the edge of the SNL 600 covers a portion of the upper surface at the edge of the polarizing plate 520, or the edge of the SNL 600 in the direction of the display area DA (the −x direction) contacts the OCA 510, a thickness of the portion of the SNL 600 closer to the display area DA (the −x direction) may be greater than that of the other portion of the SNL 600. When forming the SNL 600, a material in a liquid or paste type may be doped and hardened. A volume of the SNL 600 may be reduced in a hardening process. In this case, when the portion of the SNL 600 closer to the display area DA (the −x direction) contacts the polarizing plate 520 and/or the OCA 510, the location of the corresponding portion of the SNL 600 may become fixed. Thus, a volume reduction may occur in the remaining portion of the SNL 600 that is greater than that where the SNL 600 contacts the polarizing plate 520 and/or the OCA 510. As a result, the thickness of the portion of the SNL 600 closer to the display area DA (the −x direction) may be greater than that of the other portion of the SNL 600.

Figure 18:
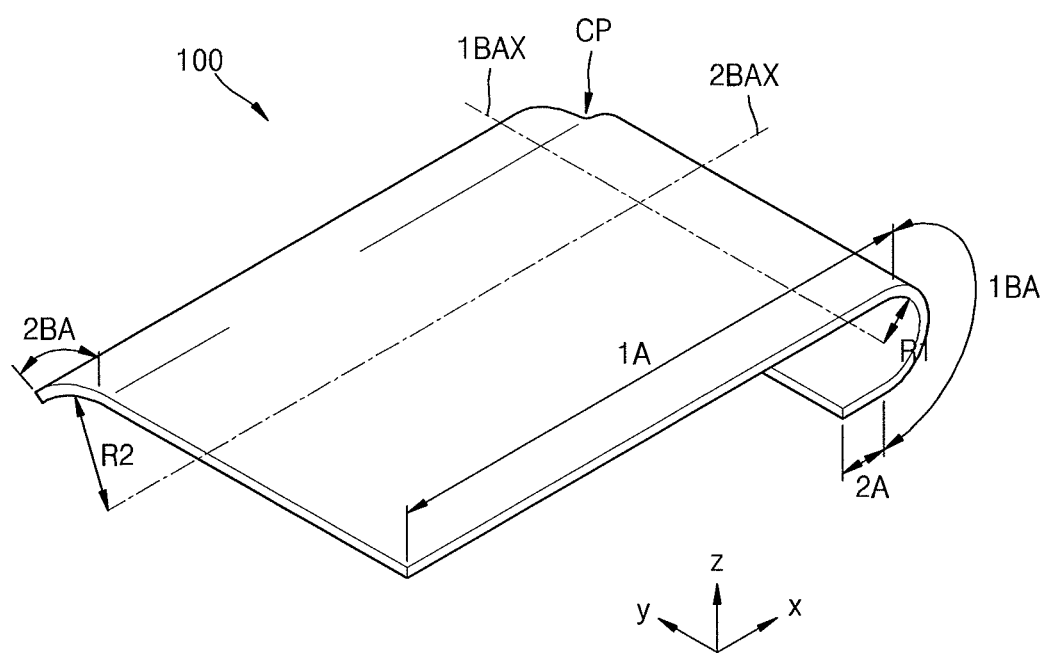
FIG. 18 illustrates a perspective view of a portion of a display apparatus according to another embodiment.
Figure 19:
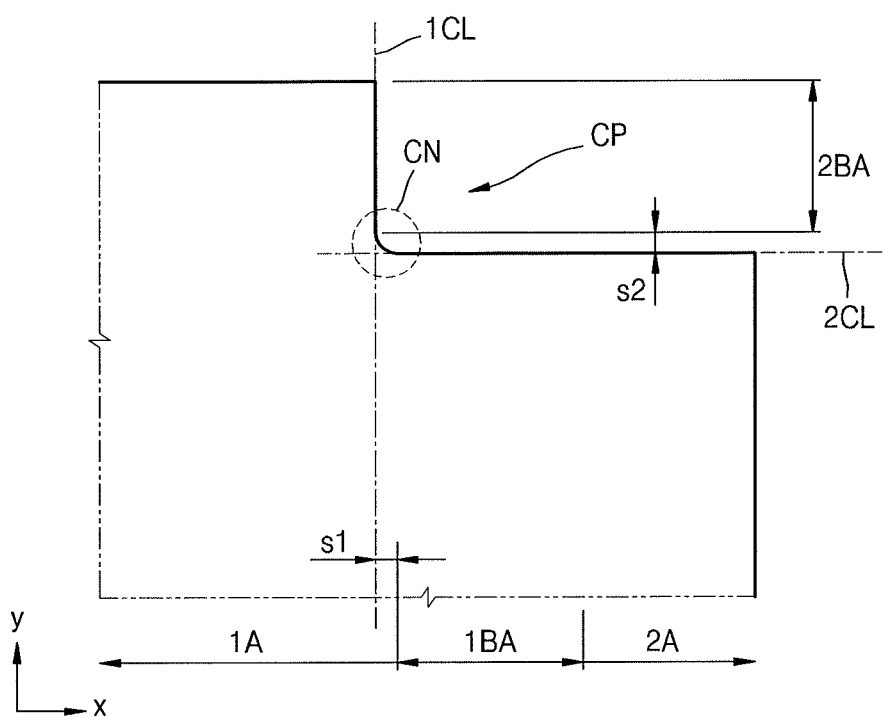
FIG. 19 illustrates a plan view of a portion of the display apparatus of FIG. 18.

FIG. 18 is a perspective view of a portion of a display apparatus, in detail, the substrate 100 according to another embodiment and FIG. 19 is a plan view of a shape of the substrate 100 in FIG. 17 before bending.

Unlike as illustrated in FIG. 1, the display apparatus according to an embodiment may include a second bending area 2BA, in addition to the first bending area 1BA. The 2BA may be arranged in the first area 1A. The substrate 100 may be bent with a second bending axis 2BAX, which extends along the second direction (the +x direction), as a center in the same manner as that the substrate 100 is bent with the first bending axis 1BAX, which extends in the first direction (the +y direction), as the center. In this case, the substrate 100 may include a chamfered portion CP due to a chamfering at an edge which is closest to a point where the first bending axis 1BAX and the second bending axis 2BAX cross each other. Due to presence of the chamfered portion CP, the substrate 100 may be simultaneously bent along the first bending axis 1BAX and the second bending axis 2BAX crossing therewith as centers.

A radius of curvature R1 in the first bending area may be smaller than the radius of curvature R2 in the second bending area 2BA. This effect may be interpreted as that the bending in the second bending area 2BA is smoother than that in the first bending area 1BA. Accordingly, the tension stress applied to components of the display apparatus in the second bending area 2BA in which the bending is smoother may be smaller than the tension stress applied to the components in the first bending area 1BA. Thus, the first inorganic insulating layer of the display apparatus according to embodiments described above may include the first opening or a first groove in the first bending area 1BA, but may be continuous in at least a portion including the second bending area 2BA in the first area 1A. "At least a portion" is in recognition that the first inorganic insulating layer may include contact holes H for an electrical connection to conductive layers arranged thereon and thereunder in the first area 1A. Contact holes H, etc. may have shapes of a circle, an ellipse, a rectangle, or shapes similar to these, when seen in a plan view, while the first opening may look like a rectangle with a high aspect ratio, when seen in the plan view.

A display device may not exist in the first bending area 1BA, but may exist in the second bending area 2BA which belongs to the first area 1A. Accordingly, an apparatus with at least a portion thereof bent may be implemented. In addition, when a user looks at a display surface of the display apparatus, the user may be led to think, by bending the display apparatus in the 2BA, that there is no display in the 2BA and a peripheral area in which a pad, etc. are arranged is narrowed.

Since the chamfered portion CP is present as described above, the substrate 100 may be simultaneously bent with the first bending axis 1BAX as well as the second bending axis 2BAX crossing therewith as centers. In this case, the chamfered portion CP may be formed round, without an acute angle, in a portion facing the central portion of the substrate 100, as illustrated in FIG. 18.

When the first bending area 1BA is bent with the first bending axis 1BAX as the center and the second bending area 2BA is bent with the second bending axis 2BAX as another center, as illustrated in FIG. 18, a high stress may be applied at a corner CN, facing the central portion of the substrate 100, of the chamfered portion CP, and the substrate 100, etc. may be torn off or damaged. Accordingly, to reduce or prevent an occurrence of such defects, the chamfered portion CP may be rounded, without an acute angle, at the corner CN facing the central portion of the substrate 100, as illustrated in FIG. 19. In this case, the radius of curvature at the corner CN, facing the central portion of the substrate 100, of the CP may be approximately about 1/20 to about 1/5 of the radius of curvature of the first bending area 1BA, e.g., about 1/10.

In addition, when the first bending area 1BA is bent with the first bending axis 1BAX as the center and the 2BA is bent with the second bending axis 2BAX as another center, the edge of the first bending area 1BA in the direction of first area 1A may be arranged more toward the edge of the substrate 100 than an extended line of a first cutting line 1CL of the chamfered portion CP as illustrated in FIG. 19, to prevent a large stress from being applied to the corner CN, facing the central portion of the substrate 100, of the chamfered portion CP. For example, a separation s1 between the edge of the first bending area 1BA in the direction of the first area 1A and the extended line of the first cutting line 1CL may be approximately about 500 μm.

An edge of the second bending area 2BA in the central direction of the substrate 100 also may be arranged more toward the edge of the substrate 100 than the extended line of a second cutting line 2CL. In this case, since the radius of curvature R2 in the second bending area 2BA is greater than the radius of curvature R1 in the first bending area 1BA as described above, a magnitude of the stress applied to the corner CN of the chamfered portion CP in the second bending area 2BA by the bending may be smaller than the corner CN of the chamfered portion CP in the first bending area 1BA. Accordingly, a separation s2 between the edge in the central direction of the substrate 100 in the second bending area 2BA and the extended line of the second cutting line 2CL may be shorter than the separation s1.

Descriptions on the corner CN of the chamfered portion CP may be applied to embodiments or subsequent various modifications thereof described above or below.

Figure 20:
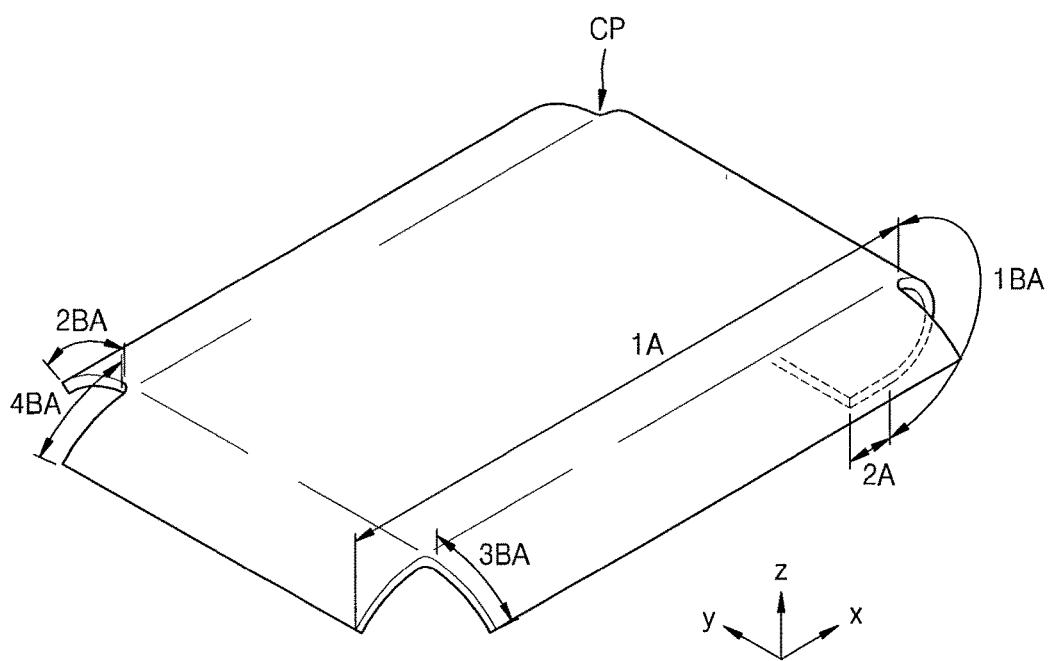
FIG. 20 illustrates a perspective view of a portion of a display apparatus according to another embodiment.

The display apparatus is illustrated to include the 2BA only in addition to the first bending area 1BA in FIG. 18; however, embodiments are not limited thereto. For example, as illustrated in FIG. 20, which is a perspective view of a portion of the display apparatus according to another embodiment, the display apparatus may include a third bending area 3BA and/or a fourth bending area 4BA in addition to the first bending area 1BA and the second bending area 2BA. In this case, all of four corners may be bent in a display apparatus including four corners. The third bending area 3BA and the fourth bending area 4BA may include configurations the same as or similar to the second bending area 2BA.

Display devices may be arranged in the second bending area 2BA, the third bending area 3BA, and the fourth bending area 4BA, which belong to the first area 1A. Accordingly, a display apparatus with all edges bent may be implemented. In addition, when the user looks at a display surface of the display apparatus, the user may be led to think, by bending the display apparatus in the second bending area 2BA through the fourth bending area 4BA, that there is no display in the second bending area 2BA through the fourth bending area 4BA and peripheral areas in which a pad, etc. are arranged are narrowed.

Figure 21:
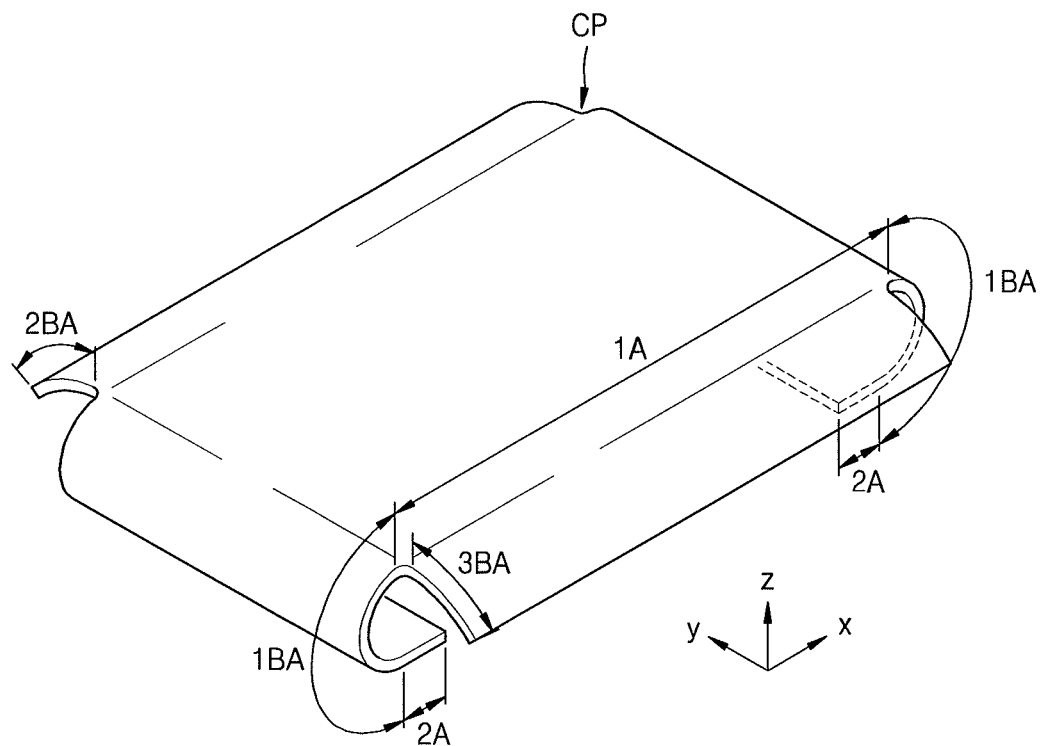
FIG. 21 illustrates a perspective view of a portion of a display apparatus according to another embodiment.

Unlike as illustrated in FIG. 20, the first bending area 1BA and the second area 2A may be arranged not only in the second direction (the +x direction) but also in an opposite direction (the −x direction), as illustrated in FIG. 21 which is a perspective view of a portion of the display apparatus according to another embodiment. Various electronic devices may be arranged in the second area 2A in the opposite direction (the −x direction) of the second direction (the +x direction) like in the second area 2A in the second direction (the +x direction), or the printed circuit board, etc. may be electrically connected in the corresponding area.

By way of summation and review, one or more embodiments provide a bendable display apparatus that may have a long usage life, while significantly reducing defect occurrences such as a broken wire during the manufacturing process. However, areas of improvement are exemplary only and embodiments are not limited thereto.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate having a first bending area between a first area and a second area, the first bending area to be bent with a first bending axis, which extends along a first direction, as a center;
   a first inorganic insulating layer on the substrate and having a first opening corresponding to the first bending area;
   a first organic material layer filling at least a portion of the first opening; and
   a first conductive layer that extends from the first area to the second area through the first bending area and is on the first organic material layer,
   wherein the first organic material layer has a concavo-convex surface at least in a portion of an upper surface thereof, and at least a portion of the first conductive layer extends along a third direction forming an angle of about 0° to about 90° with the first direction, wherein
   a maximum height of the concavo-convex surface of the first organic material layer from the substrate is smaller than a height of a top surface of the first inorganic insulating layer from the substrate, wherein:
   the first area includes a display area having a display device, and
   the concavo-convex surface of the first organic material layer does not overlap the display area.

2. The display apparatus as claimed in claim 1, wherein at least a portion of the first conductive layer extends along the third direction in the first bending area.

3. The display apparatus as claimed in claim 2, wherein the third direction forms an angle of about 45° with the first direction, and at least a portion of the first conductive layer forms an angle of about 45° with the first bending axis.

4. The display apparatus as claimed in claim 2, wherein the third direction forms an angle of about 90° with the first direction, and at least a portion of the first conductive layer is perpendicular to the first bending axis.

5. The display apparatus as claimed in claim 2, wherein at least a portion of the first conductive layer is in parallel with the first bending axis.

6. The display apparatus as claimed in claim 1, wherein an area of the first opening is greater than that of the first bending area.

7. The display apparatus as claimed in claim 1, wherein the first organic material layer has the concavo-convex surface only in the first opening.

8. The display apparatus as claimed in claim 1, wherein a shape of an upper surface of the first conductive layer on the first organic material layer corresponds to that of an upper surface of the first organic material layer.

9. The display apparatus as claimed in claim 1, wherein the concavo-convex surface includes a plurality of protrusion axes that extend along a fourth direction forming an angle of about 0° to about 90° with the first direction.

10. The display apparatus as claimed in claim 9, wherein the concavo-convex surface includes a plurality of protruded areas respectively formed with the plurality of protrusion axes as centers, in a fifth direction perpendicular to the fourth direction.

11. The display apparatus as claimed in claim 10, wherein distances between a central portion of the first opening and the plurality of protrusion axes are shorter than those between another portion in the first opening and the plurality of protrusion axes.

12. The display apparatus as claimed in claim 10, wherein heights from an upper surface of the substrate to the plurality of protruded areas, at a central portion of the first opening are greater than those from the upper surface of the substrate to the plurality of protruded areas, at another portion of the first opening.

13. The display apparatus as claimed in claim 1, further comprising a second organic material layer on the first conductive layer, the second organic material layer filling at least a portion of the first opening.

14. The display apparatus as claimed in claim 13, wherein the second organic material layer includes a concavo-convex surface at least at a portion of an upper surface thereof.

15. The display apparatus as claimed in claim 14, the second organic material layer includes the concavo-convex surface only in the first opening.

16. The display apparatus as claimed in claim 15, wherein a shape of the concavo-convex surface on the upper surface of the second organic material layer corresponds to that of the concavo-convex surface on the upper surface of the first organic material layer.

17. The display apparatus as claimed in claim 1, wherein the first conductive layer includes a first surface facing the substrate at least at a portion thereof, a second surface, opposite to the first surface, and at least one hole penetrating from the first surface to the second surface.

18. The display apparatus as claimed in claim 17, wherein the first conductive layer has the hole only in the first opening.

19. The display apparatus as claimed in claim 17, wherein the first conductive layer includes the hole only at locations corresponding to the first bending area.

20. The display apparatus as claimed in claim 1, further comprising a stress neutralization layer over the first conductive layer, wherein the stress neutralization layer includes an organic material.

21. The display apparatus as claimed in claim 1, further comprising a thin film transistor in the first area or the second area, wherein the thin film transistor includes, a semiconductor layer, a source electrode, a drain electrode, and a gate electrode; and an encapsulation layer that covers a display device in the first area.

22. The display apparatus as claimed in claim 1, further comprising a second conductive layer in the first area or the second area, wherein the second conductive layer is on a layer different from the first conductive layer is and is electrically connected to the first conductive layer.

23. The display apparatus as claimed in claim 1, wherein an elongation percentage of the first conductive layer is greater than that of a second conductive layer.

* * * * *